US012765085B2

(12) United States Patent
Suzuki

(10) Patent No.: US 12,765,085 B2
(45) Date of Patent: Oct. 13, 2026

(54) IMAGE SENSOR DEVICE, EQUIPMENT, AND METHOD OF MANUFACTURING IMAGE SENSOR DEVICE

(71) Applicant: SONY SEMICONDUCTOR SOLUTIONS CORPORATION, Kanagawa (JP)

(72) Inventor: Masami Suzuki, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 147 days.

(21) Appl. No.: 18/714,114

(22) PCT Filed: Oct. 13, 2022

(86) PCT No.: PCT/JP2022/038249

§ 371 (c)(1),
(2) Date: May 29, 2024

(87) PCT Pub. No.: WO2023/105921

PCT Pub. Date: Jun. 15, 2023

(65) Prior Publication Data

US 2025/0022893 A1 Jan. 16, 2025

(30) Foreign Application Priority Data

Dec. 6, 2021 (JP) ................................ 2021-197960

(51) Int. Cl.
*H10F 39/00* (2025.01)

(52) U.S. Cl.
CPC ......... *H10F 39/802* (2025.01); *H10F 39/026* (2025.01); *H10F 39/811* (2025.01)

(58) Field of Classification Search
CPC .............................. H04N 1/028; H10F 39/804
See application file for complete search history.

(56) References Cited

U.S. PATENT DOCUMENTS

2009/0066797 A1* 3/2009 Miyachi ................ H04N 23/57 348/207.99
2019/0165019 A1* 5/2019 Wang .................... H10F 39/811
2019/0375628 A1* 12/2019 Besling ................ B81C 1/0023

FOREIGN PATENT DOCUMENTS

JP 2013-150311 A 8/2013
JP 2014-534611 A 12/2014
(Continued)

OTHER PUBLICATIONS

International Search Report and Written Opinion of PCT Application No. PCT/JP2022/038249, issued on Jan. 17, 2023, 09 pages of ISRWO.

*Primary Examiner* — Thanh Luu
(74) *Attorney, Agent, or Firm* — CHIP LAW GROUP

(57) ABSTRACT

It is a main object to provide an image sensor device that can reduce the risks of damage to and/or contamination of its components during manufacturing. The image sensor device according to the present technology is an image sensor device including a substrate and a plurality of sensor units arranged in at least one axis direction on the substrate. Each of the plurality of sensor units includes a pixel chip including a plurality of pixels, and a translucent cover configured to cover the pixel chip. With the image sensor device according to the present technology, there can be provided an image sensor device that can reduce the risks of damage to and/or contamination of its components during manufacturing.

19 Claims, 41 Drawing Sheets

(56) References Cited

FOREIGN PATENT DOCUMENTS

| | | | |
|---|---|---|---|
| JP | 2017-183386 | A | 10/2017 |
| JP | 2019-519967 | A | 7/2019 |
| JP | 2019-160866 | A | 9/2019 |

* cited by examiner

IMAGE SENSOR DEVICE, EQUIPMENT, AND METHOD OF MANUFACTURING IMAGE SENSOR DEVICE

CROSS REFERENCE TO RELATED APPLICATIONS

This application is a U.S. National Phase of International Patent Application No. PCT/JP2022/038249 filed on Oct. 13, 2022, which claims priority benefit of Japanese Patent Application No. JP 2021-197960 filed in the Japan Patent Office on Dec. 6, 2021. Each of the above-referenced applications is hereby incorporated herein by reference in its entirety.

TECHNICAL FIELD

The technology according to the present disclosure (hereinafter also referred to as the "present technology") relates to an image sensor device, equipment, and a method of manufacturing the image sensor device.

BACKGROUND ART

Hitherto, there has been known an image sensor device in which a plurality of pixel chips juxtaposed on a substrate are covered with a long translucent cover (see, for example, PTL 1).

CITATION LIST

Patent Literature

[PTL 1]
Japanese Patent Laid-Open No. 2013-150311

SUMMARY

Technical Problem

However, in the related-art image sensor device, there has been room for improvement regarding reduction of risks of damage to and/or contamination of its components during manufacturing.

It is therefore a main object of the present technology to provide an image sensor device that can reduce the risks of damage to and/or contamination of its components during manufacturing.

Solution to Problem

The present technology provides an image sensor device including a substrate, and a plurality of sensor units arranged in at least one axis direction on the substrate, in which each of the plurality of sensor units includes a pixel chip including a plurality of pixels, and a translucent cover configured to cover the pixel chip.

The plurality of sensor units may be arranged in the one axis direction.

The substrate and each of the plurality of sensor units may have longitudinal directions that substantially match the one axis direction.

The translucent cover may have a plate shape, and each of the plurality of sensor units may further include a spacer disposed between the pixel chip and the translucent cover.

Each of the plurality of sensor units may further include a mounting substrate on which the pixel chip is mounted.

The pixel chip may protrude on at least one side in the one axis direction with respect to the mounting substrate.

The pixel chip may protrude on the at least one side with respect to the mounting substrate by at least an amount corresponding to a difference between a linear expansion coefficient of the pixel chip and a linear expansion coefficient of the mounting substrate.

The image sensor device may further include a positioning structure configured to position the substrate and a corresponding one of the plurality of sensor units.

The positioning structure may include a pin and a first bolt insertion hole provided to one of the substrate and the mounting substrate, a pin insertion hole which is provided in the other of the substrate and the mounting substrate and into which the pin is inserted, a second bolt insertion hole provided at a position corresponding to the first bolt insertion hole of the other of the substrate and the mounting substrate, a bolt inserted through the first bolt insertion hole and the second bolt insertion hole, and a nut threadedly engaged with the bolt.

The pin insertion hole may include a round hole into which the pin is fitted, and the first bolt insertion hole and the second bolt insertion hole may include elongated holes with a length in a transverse direction greater than a diameter of a screw portion of the bolt.

A plurality of sets of the first bolt insertion holes and the second bolt insertion holes may be provided, the bolt may include a plurality of bolts corresponding to the plurality of sets, and the positioning structure may include at least one spacer through which at least one of the plurality of bolts is inserted and which is disposed between the substrate and the mounting substrate.

The positioning structure may include a plurality of first bolt insertion holes provided in one of the substrate and the mounting substrate, a plurality of second bolt insertion holes provided at respective positions corresponding to the plurality of first bolt insertion holes of the other of the substrate and the mounting substrate, a plurality of bolts inserted through respective ones of a plurality of sets of the first bolt insertion holes and the second bolt insertion holes corresponding to each other, and a plurality of nuts threadedly engaged with respective ones of the plurality of bolts.

The first bolt insertion holes and the second bolt insertion holes may include elongated holes with a length in a transverse direction greater than a diameter of screw portions of the bolts.

At least three sets of the first bolt insertion holes and the second bolt insertion holes may be provided, the bolt may include at least three bolts corresponding to the at least three sets, and the positioning structure may include at least one spacer through which at least one of the at least three bolts is inserted and which is disposed between the substrate and the mounting substrate.

The pixel chip may be electrically connected to the mounting substrate by wire bonding.

The pixel chip may include a pixel substrate with a pixel region in which the plurality of pixels are provided, and the pixel substrate may be provided with a through electrode for electrically connecting an electrode pad provided on an opposite side of a side of the mounting substrate of the pixel substrate to the mounting substrate.

Each of the plurality of sensor units may be a sensor unit for imaging.

Each of the plurality of sensor units may be a sensor unit for ranging.

The plurality of sensor units may include a sensor unit for imaging and a sensor unit for ranging.

The present technology also provides equipment including the image sensor device.

The present technology also provides a method of manufacturing an image sensor device including a step of generating a plurality of sensor units each including a pixel chip and a translucent cover configured to cover the pixel chip, and a step of arranging and mounting the plurality of sensor units in at least one axis direction on a substrate.

The step of mounting may involve fixing, after adjusting a position of each of the sensor units with respect to the substrate, the sensor units to the substrate.

DESCRIPTION OF EMBODIMENT

A preferred embodiment of the present technology is described in detail below with reference to the attached drawings. Note that, in the present specification and the drawings, components having substantially the same functional configurations are denoted by the same reference signs to omit the overlapped description. The embodiment described below represents a representative embodiment of the present technology, and the scope of the present technology is not narrowly interpreted on the basis of this. Herein, even in a case where it is described that each of an image sensor device, equipment, and a method of manufacturing the image sensor device according to the present technology provides a plurality of effects, it is sufficient if each of the image sensor device, the equipment, and the method of manufacturing the image sensor device according to the present technology provides at least one effect. The effects described herein are merely exemplary and not limitative, and there may be other effects.

Further, descriptions are given in the following order.

0. Introduction
1. Image Sensor Device According to Embodiment of Present Technology
2. Image Sensor Devices According to Modified Examples 1 to 9 of Present Technology
3. Other Modified Examples of Present Technology
4. Usage Examples of Image Sensor Device According to Present Technology
5. Other Usage Examples of Image Sensor Device According to Present Technology
6. Application Example to Mobile Body
7. Application Example to Endoscopic Surgery System

0. Introduction

In related-art image sensor units (see, for example, PTL 1), a plurality of sensor substrates provided with sensor chips are arranged and accommodated in a case including a substrate holder and a frame, and a single long transparent substrate is attached over an opening of the frame to seal the case.

In the image sensor unit in question, it is difficult to handle the long transparent substrate during manufacturing, and there is a high risk of damage to the components such as the transparent substrate and the sensor chips. Further, in the image sensor unit in question, the time required for sealing is long as all sensor substrates are assembled into the case and the transparent substrate is then attached, and hence, there is a high risk of foreign particles entering the case to contaminate the components such as the transparent substrate and the sensor chips.

Thus, after intensive studies, the inventor has developed an image sensor device according to the present technology as an image sensor device that can reduce the risks of damage to and/or contamination of the components during manufacturing.

1. Image Sensor Device According to Embodiment of Present Technology

Figure 1:
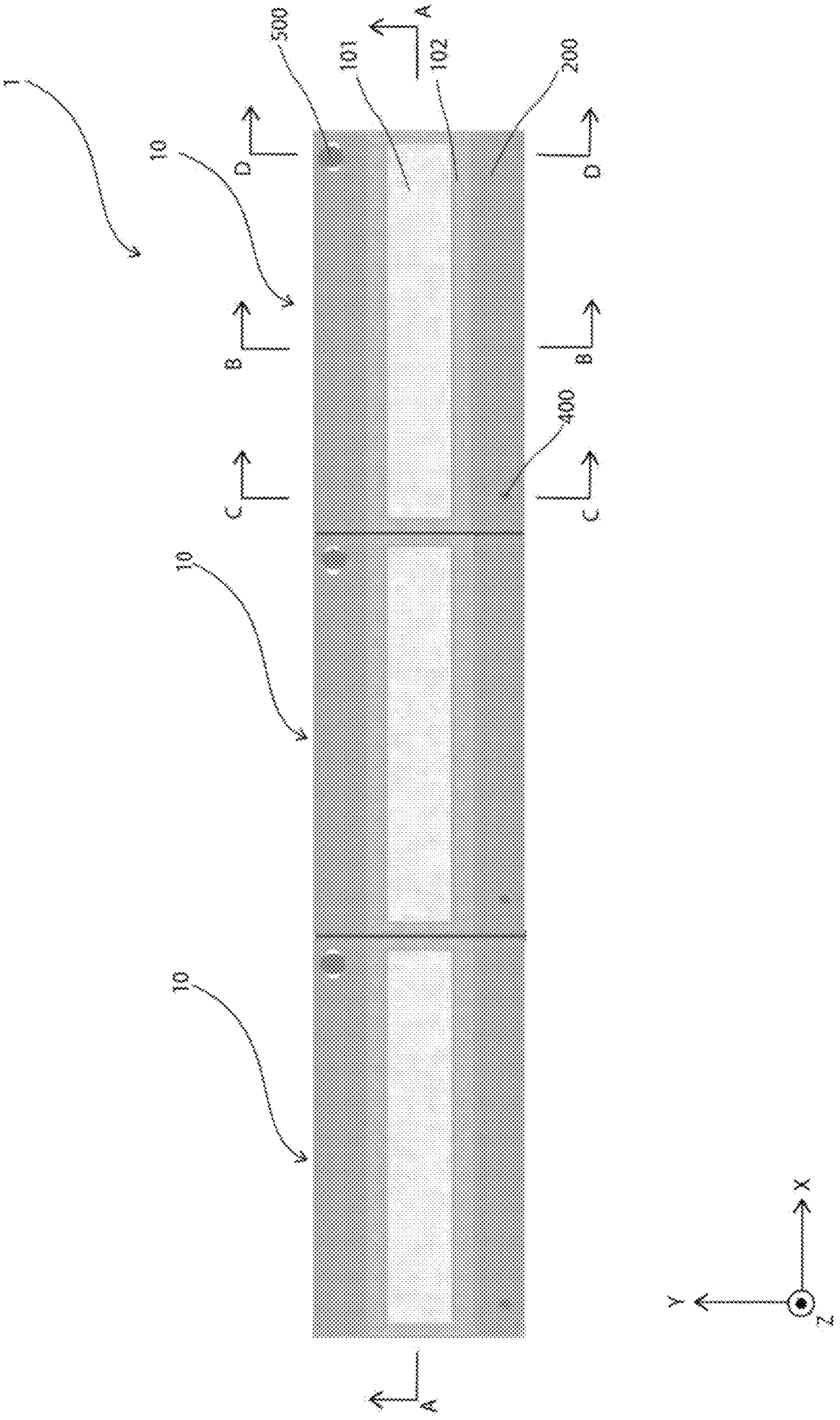
FIG. 1 is a plan view of an image sensor device according to an embodiment of the present technology.
Figure 2:
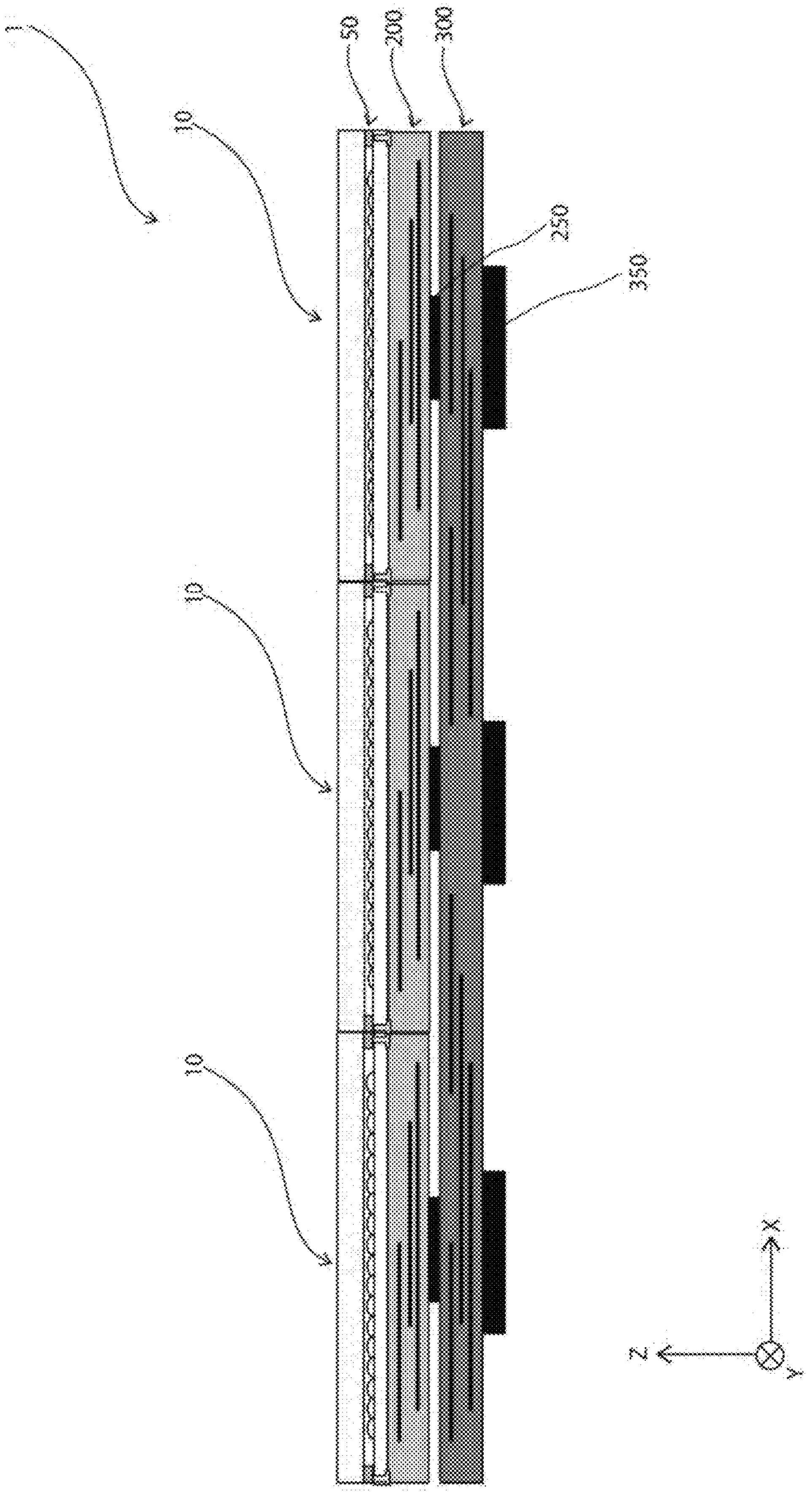
FIG. 2 is a sectional view along a line A-A of FIG. 1.
Figure 3:
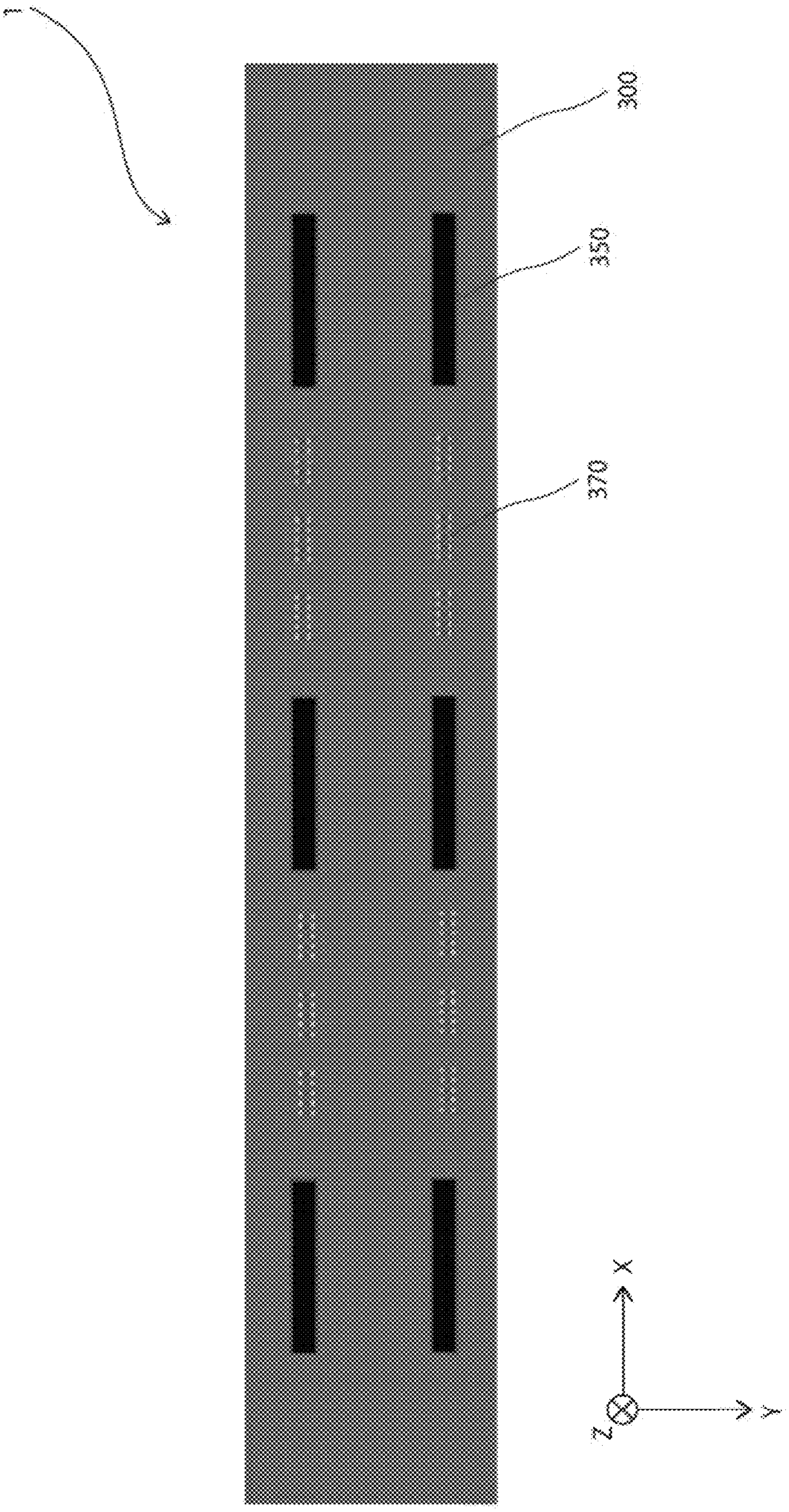
FIG. 3 is a bottom view of the image sensor device according to the embodiment.
Figure 4:
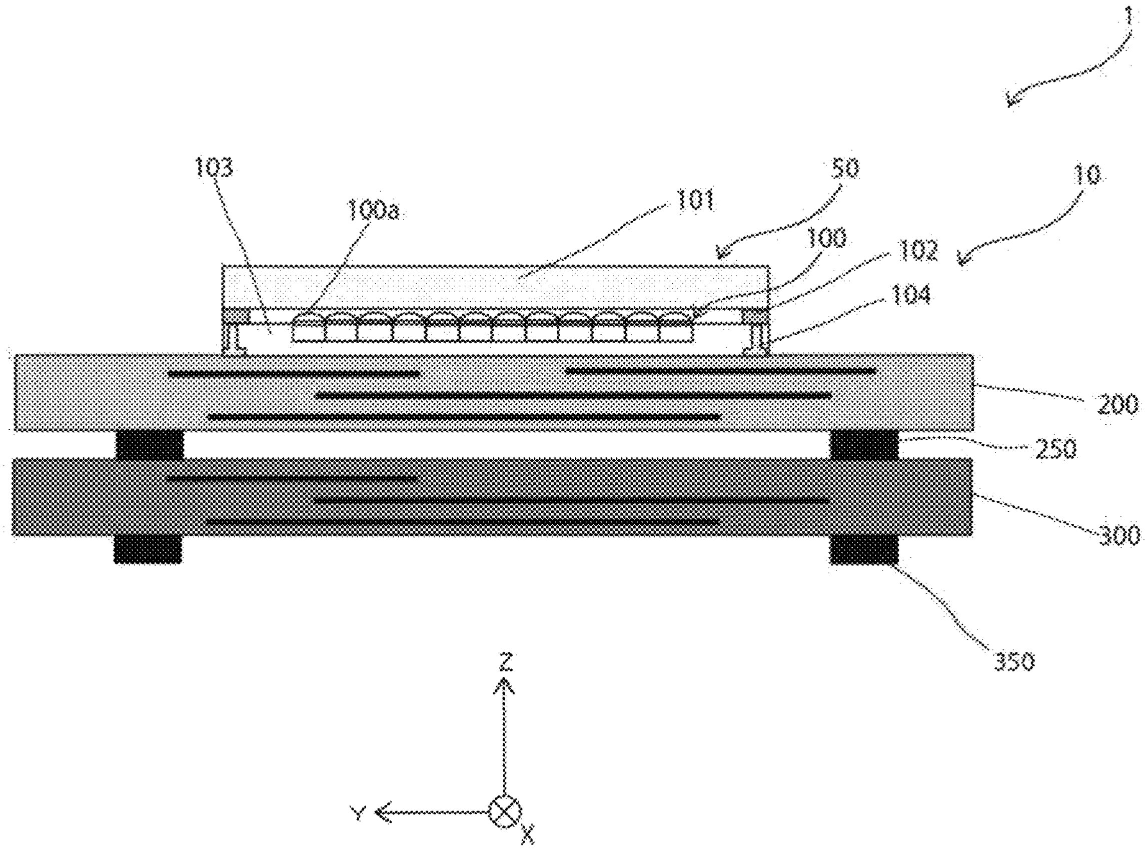
FIG. 4 is a sectional view along a line B-B of FIG. 1.
Figure 5:
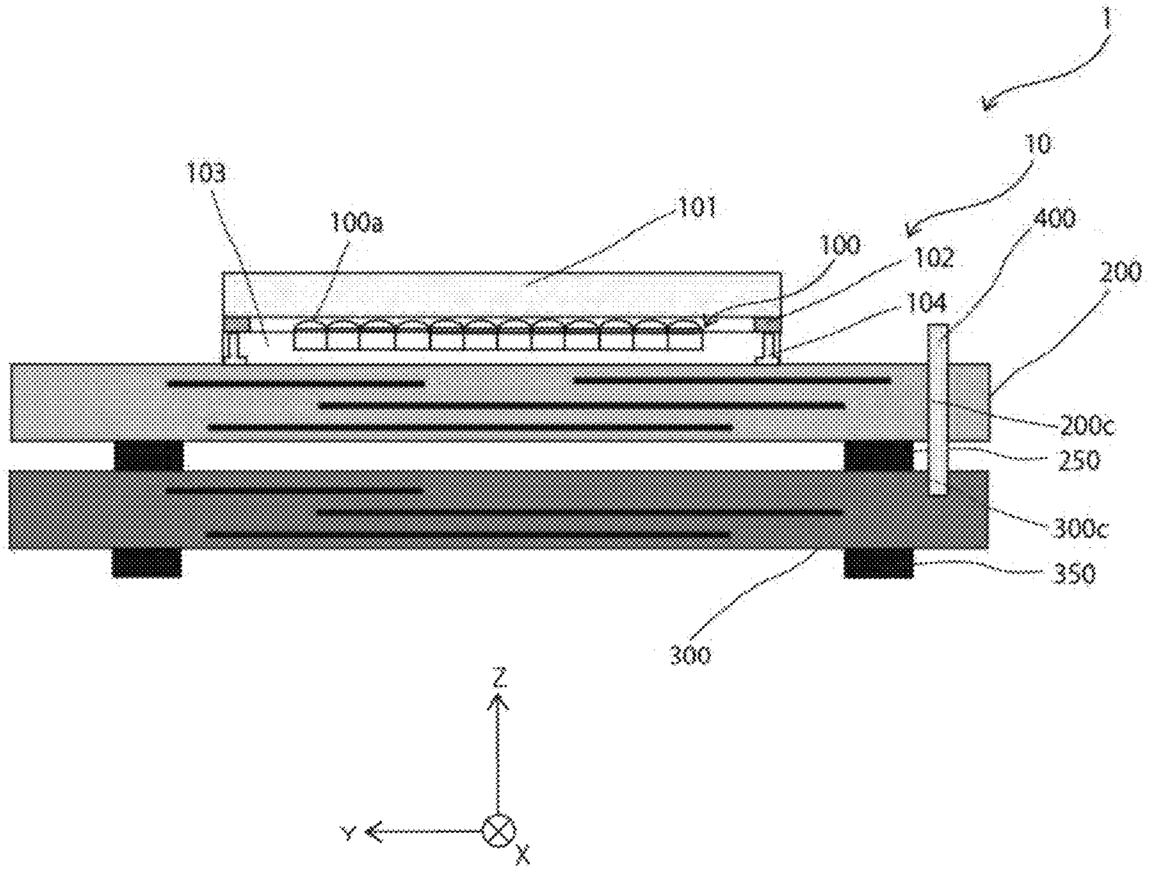
FIG. 5 is a sectional view along a line C-C of FIG. 1.
Figure 6:
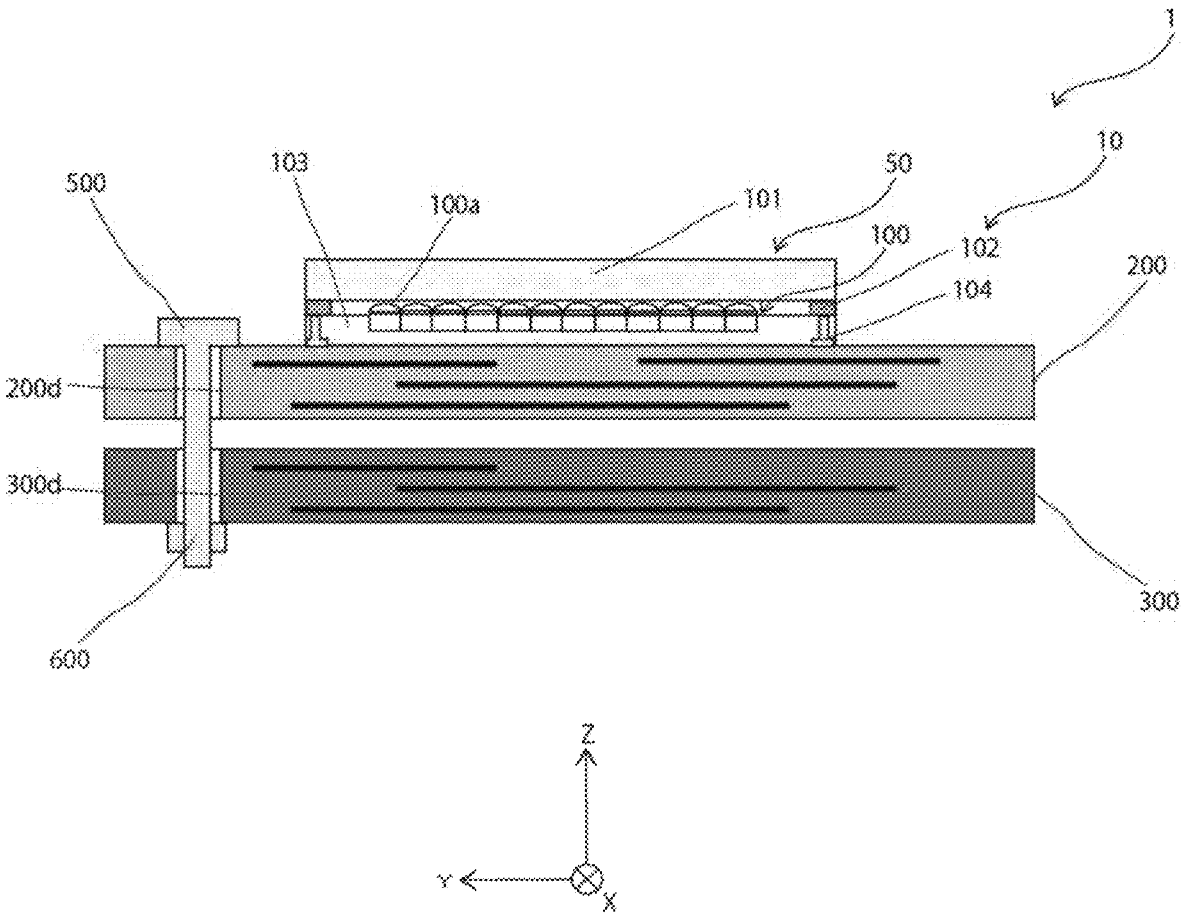
FIG. 6 is a sectional view along a line D-D of FIG. 1.
Figure 7:
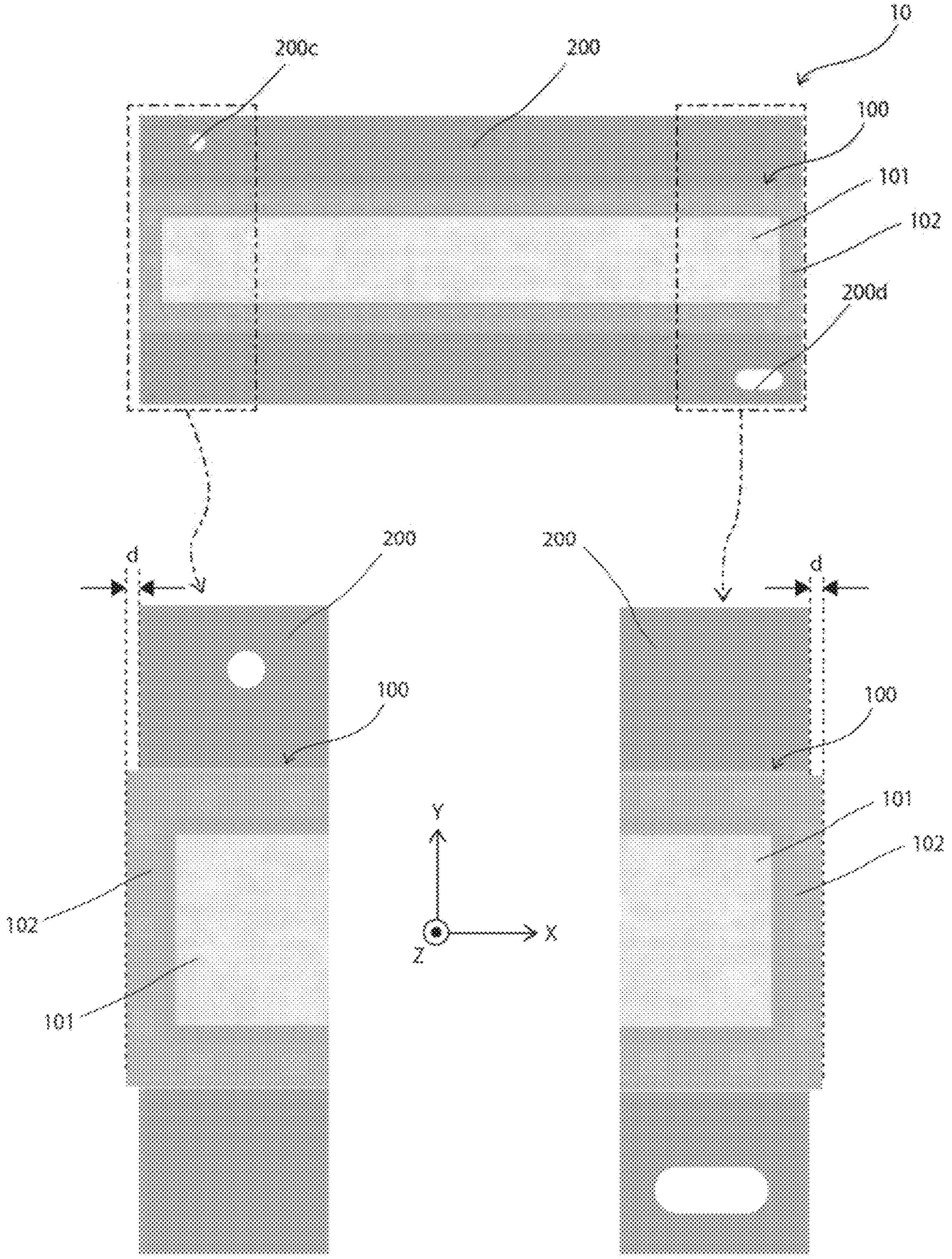
FIG. 7 includes a plan view of a sensor unit and a partial enlarged view thereof.
Figure 8:
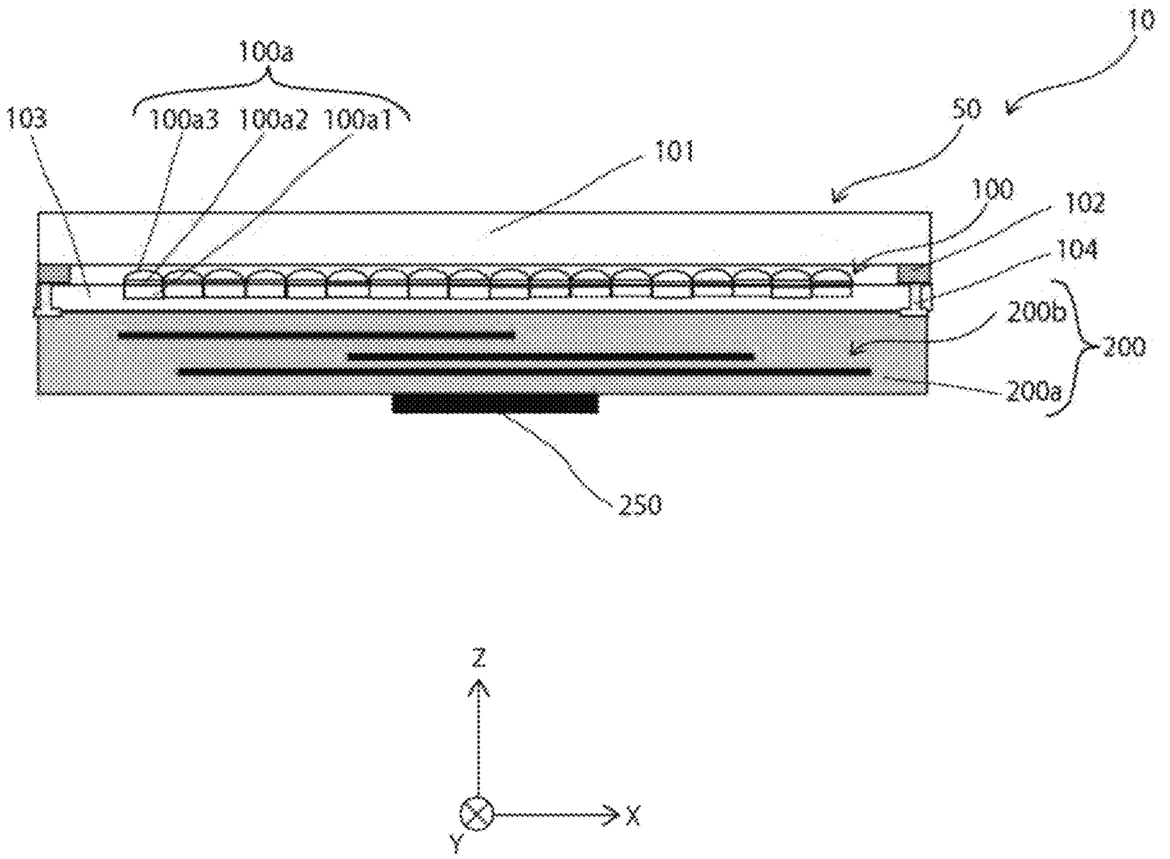
FIG. 8 is a sectional view of the sensor unit corresponding to FIG. 2.
Figure 9:
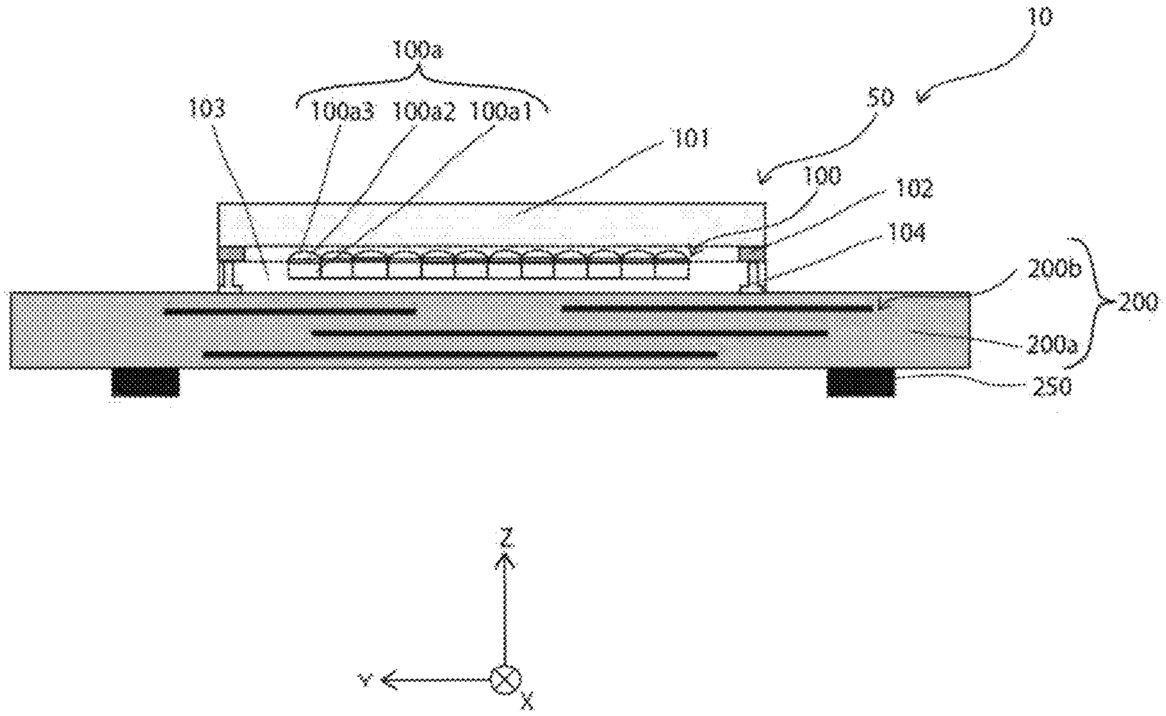
FIG. 9 is a sectional view of the sensor unit corresponding to FIG. 4.
Figure 10:
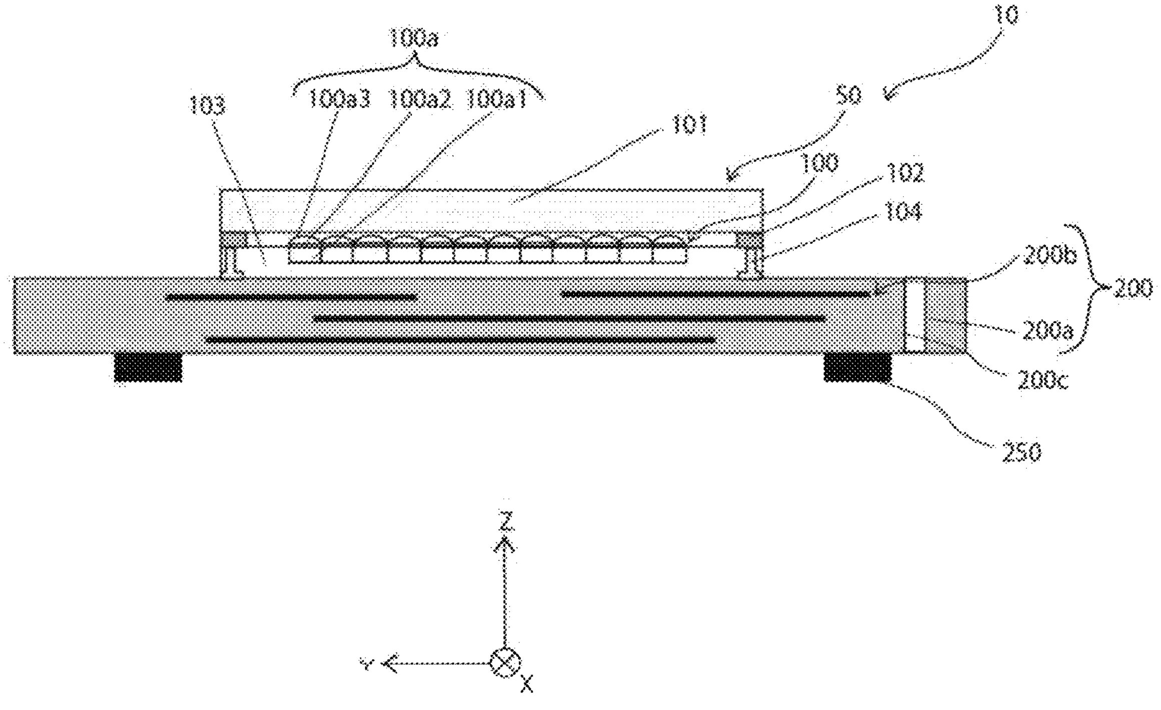
FIG. 10 is a sectional view of the sensor unit corresponding to FIG. 5.
Figure 11:
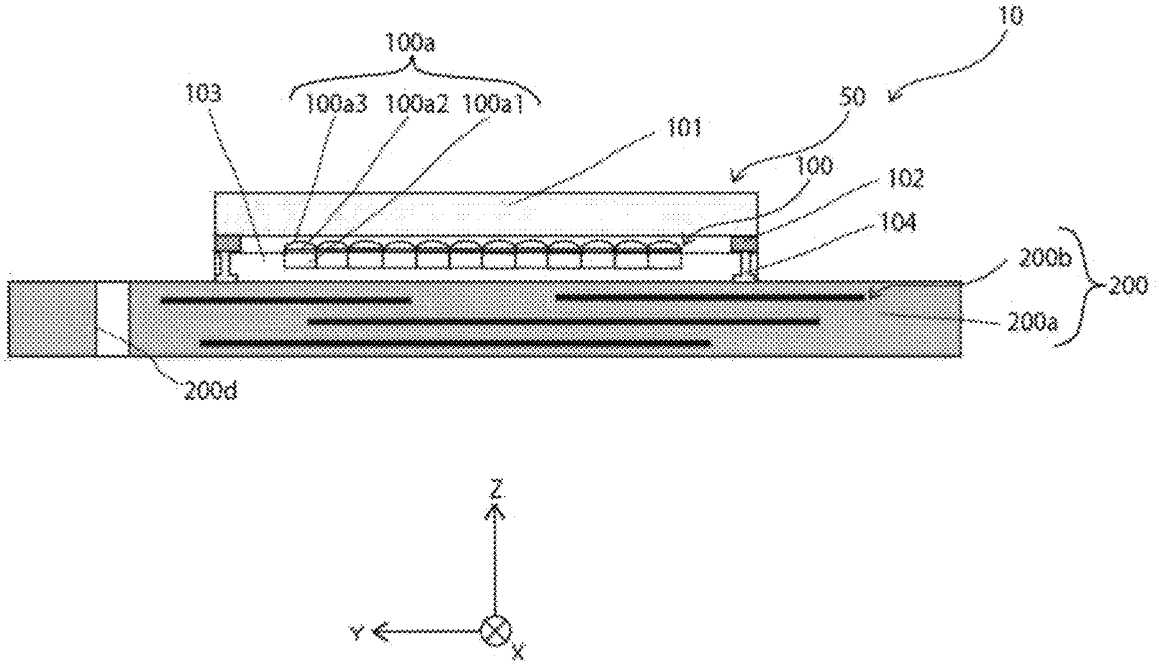
FIG. 11 is a sectional view of the sensor unit corresponding to FIG. 6.

Now, an image sensor device according to an embodiment of the present technology is described with reference to the drawings. FIG. 1 is a plan view of an image sensor device 1 according to the embodiment of the present technology. FIG. 2 is a sectional view along a line A-A of FIG. 1. FIG. 3 is a bottom view of the image sensor device 1 according to the embodiment. FIG. 4 is a sectional view along a line B-B of FIG. 1. FIG. 5 is a sectional view along a line C-C of FIG. 1. FIG. 6 is a sectional view along a line D-D of FIG. 1. FIG. 7 includes a plan view of a sensor unit and a partial enlarged view thereof. In the following, an XYZ three-dimensional orthogonal coordinate system depicted in FIG. 1 and the like is appropriately used for description.

<<Configuration of Image Sensor Device>>

The image sensor device 1 according to the embodiment of the present technology is, for example, a linear image sensor. The image sensor device 1, which is a linear image sensor, scans an object irradiated with light (including natural light and artificial light) by moving relative to the object in a direction orthogonal to a longitudinal direction, for example, to generate image data (two-dimensional image information, three-dimensional image information, or the like) and/or sensing data (ranging information, shape information, or the like) regarding the object.

The image sensor device 1 includes, for example, as depicted in FIG. 1 to FIG. 3, a substrate 300 and a plurality of (for example, three) sensor units 10 arranged in at least an X-axis direction (one axis direction) on the substrate 300. The image sensor device 1 further includes, for example, a positioning structure configured to position the substrate 300 and a corresponding one of the plurality of sensor units 10.

That is, the image sensor device 1 forms a single linear image sensor with the plurality of sensor units 10 positioned with respect to each other on the substrate 300.

The substrate 300 and each of the plurality of sensor units 10 have longitudinal directions that substantially match the X-axis direction. Here, a transverse direction of each of the sensor units 10 is a Y-axis direction, and a direction orthogonal to both the longitudinal and transverse directions of each of the sensor units 10 is a Z-axis direction.

[Substrate]

Figure 14:
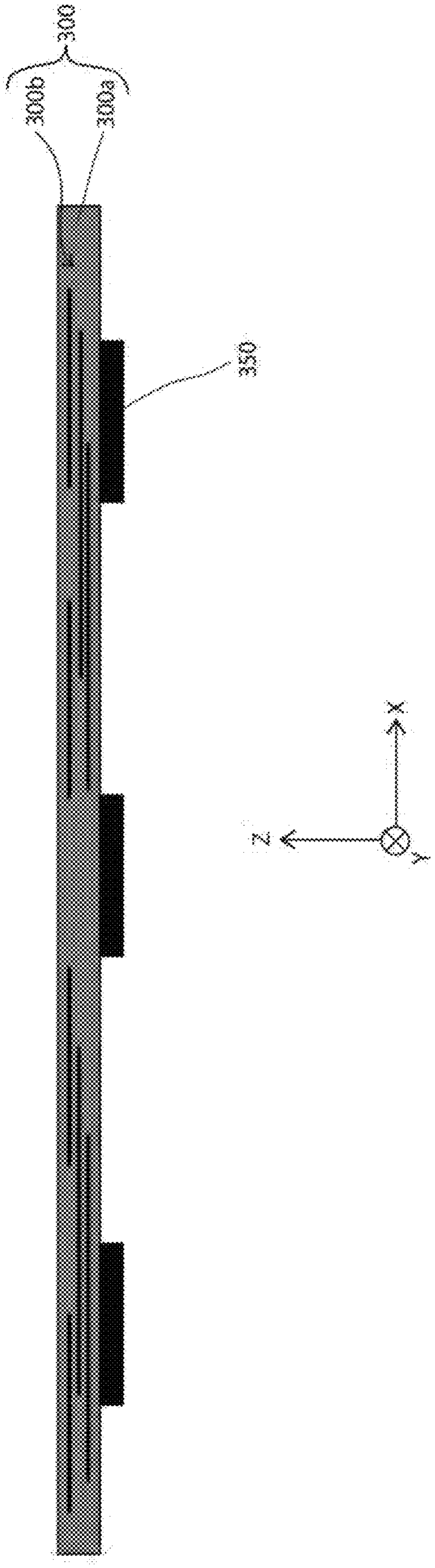
FIG. 14 is a sectional view along a line E-E of FIG. 13.

The substrate 300 includes, for example, an insulating layer 300*a* and an internal wiring line 300*b* provided within the insulating layer 300*a* (see FIG. 14). The internal wiring line 300*b* is, for example, a multilayer wiring line, but may be a single-layer wiring line. On the back surface (−Z-side surface) of the substrate 300, connectors 350 electrically connected to circuit boards (for example, printed wiring boards) and peripheral components 370 are provided (see FIG. 3).

[Sensor Unit]

Each of the plurality of sensor units 10 includes, for example, as depicted in FIG. 4 to FIG. 6, a pixel chip 100 including a plurality of pixels 100*a* and a plate-shaped translucent cover 101 configured to cover the pixel chip 100.

Each of the plurality of sensor units 10 further includes a spacer 102 disposed between the pixel chip 100 and the translucent cover 101.

Each of the plurality of sensor units 10 further includes, as depicted in FIG. 1 to FIG. 7, a mounting substrate 200 on which the pixel chip 100 is mounted. The portion excluding the mounting substrate 200 of the sensor unit 10 is also referred to as a "sensor section 50."

(Mounting Substrate)

Figure 12:
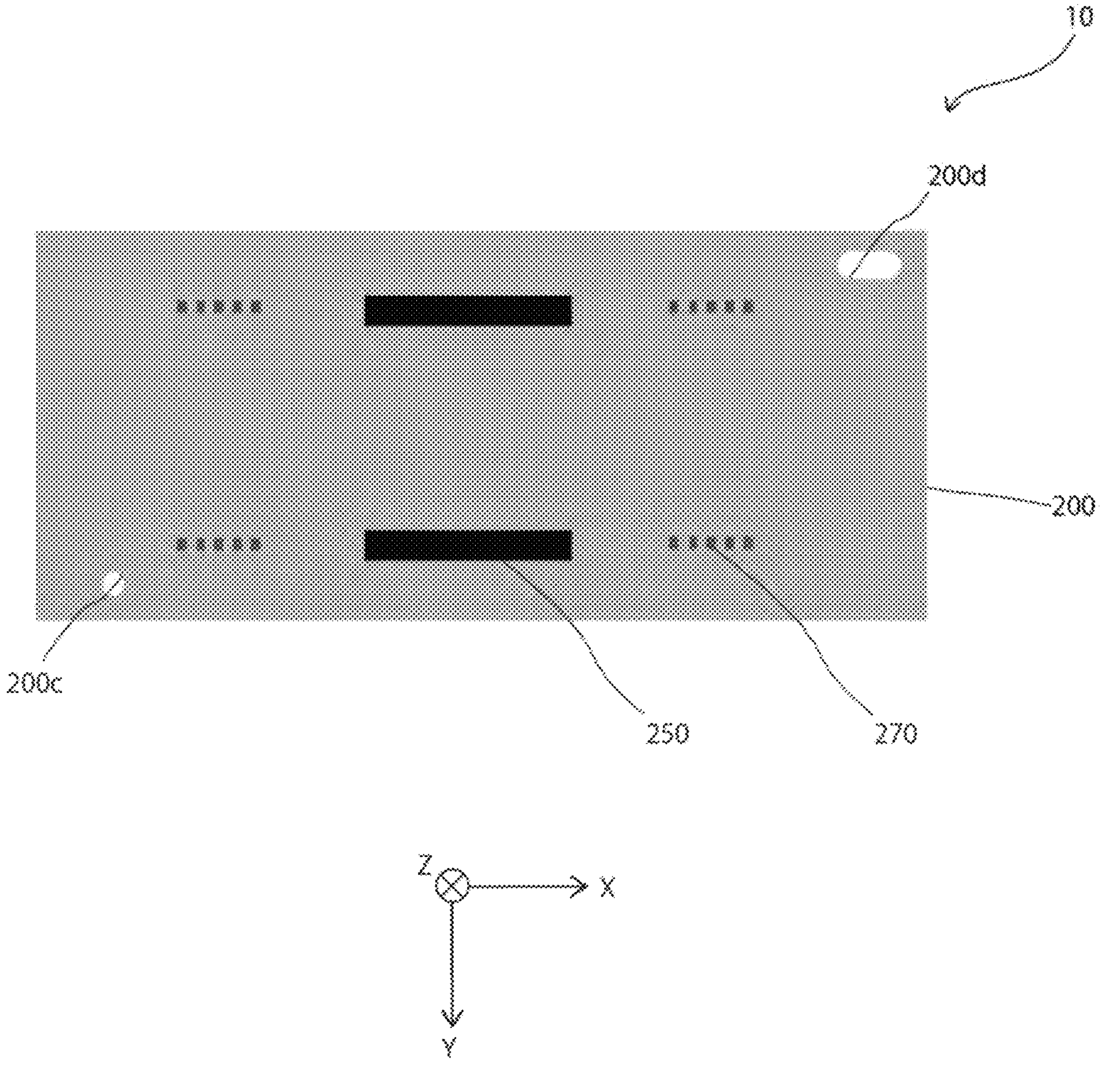
FIG. 12 is a bottom view of the sensor unit.
Figure 13:
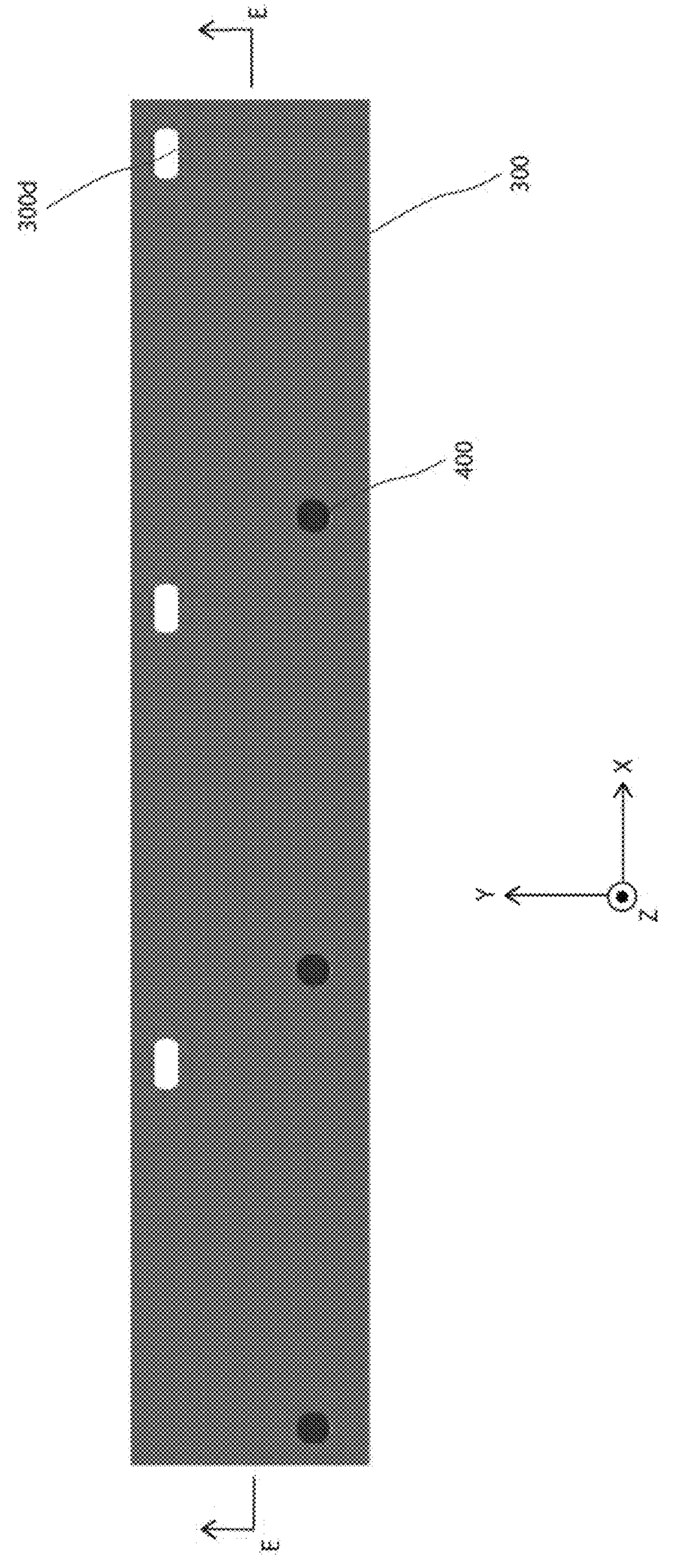
FIG. 13 is a plan view of a substrate.

The mounting substrate 200 includes, as depicted in FIG. 8 to FIG. 11, for example, an insulating layer 200*a* and an internal wiring line 200*b* provided within the insulating layer 200*a*. The internal wiring line 200*b* is, for example, a multilayer wiring line, but may be a single-layer wiring line. On the back surface (−Z-side surface) of the mounting substrate 200, connectors 250 electrically connected to the substrate 300 and peripheral components 270 are provided (see FIG. 12).

(Pixel Chip)

The pixel chip 100 includes the plurality of pixels 100*a*. The plurality of pixels 100*a* are arranged two-dimensionally along an XY plane (for example, arranged in a matrix in the X-axis and Y-axis directions), for example. Here, the plurality of pixels 100*a* are arranged in a matrix such that the number of pixels in the X-axis direction (row direction) (number of rows) is greater than the number of pixels in the Y-axis direction (column direction) (number of columns). That is, the plurality of pixels 100*a* are arranged to form a rectangular pixel region whose longitudinal direction matches the X-axis direction. As an example, the planar shape of the pixel chip 100 is also rectangular.

Each of the pixels 100*a* includes a photoelectric conversion element 100*a*1, a color filter 100*a*2 disposed on the photoelectric conversion element 100*a*1, and a micro lens 100*a*3 disposed on the color filter 100*a*2.

The photoelectric conversion element 100*a*1 is, for example, a PD (photodiode). More specifically, the photoelectric conversion element in question may be, for example, a PN photodiode, a PIN photodiode, a SPAD (Single Photon Avalanche Photodiode), an APD (avalanche photo Diode), or the like.

The pixel chip 100 includes a semiconductor substrate 103 serving as a pixel substrate with a pixel region in which the plurality of pixels 100*a* are provided. The photoelectric conversion elements 100*a*1 are provided within the semiconductor substrate 103. The semiconductor substrate 103 is provided with through electrodes 104 for electrically connecting electrode pads for wire bonding provided on the opposite side of the mounting substrate 200 side of the semiconductor substrate 103 (provided in the spacer 102 described later, for example) to the mounting substrate 200, for example. The through electrode 104 includes a via penetrating the semiconductor substrate 103 and having one end connected to the electrode pad and a land provided on the surface on the mounting substrate 200 side of the semiconductor substrate 103 and connected to the other end of the via. The land is electrically connected to the mounting substrate 200 via a metal bump (for example, solder ball). Here, a chip refers to a component having mounted thereon an integrated circuit and obtained by singulating a wafer.

The semiconductor substrate 103 is, for example, a Si substrate, a Ge substrate, a GaAs substrate, an InGaAs substrate, or the like. The semiconductor substrate 103 is provided with, for example, the plurality of pixels 100*a* and a control circuit (analog circuit) configured to control each of the pixels 100*a*. The control circuit in question includes circuit elements such as transistors, for example. In detail, the control circuit in question includes, for example, a plurality of pixel transistors (what are generally called MOS transistors). The plurality of pixel transistors can include, for example, three transistors, namely, a transfer transistor, a reset transistor, and an amplification transistor. In another configuration, the plurality of pixel transistors can also include four transistors including a selection transistor in addition to the three transistors. The equivalent circuit of a unit pixel is similar to the typical one, and hence, the detailed description thereof is omitted. A pixel can be configured as a single unit pixel. Further, a pixel can be configured in a shared pixel structure. This shared pixel structure is a structure in which a plurality of photodiodes share a floating diffusion forming a transfer transistor and transistors other than the transfer transistor.

The pixel chip 100 protrudes on at least one side (for example, both sides) in the X-axis direction with respect to the mounting substrate 200 (see FIG. 7), for example. In detail, the pixel chip 100 protrudes on at least one side (for example, both sides) in the X-axis direction with respect to the mounting substrate 200 by at least an amount d corresponding to the difference between the linear expansion coefficient of the pixel chip 100 (for example, a linear expansion coefficient approximately equal to the linear expansion coefficient of the semiconductor substrate 103) and the linear expansion coefficient of the mounting substrate 200 (for example, a linear expansion coefficient greater than the linear expansion coefficient of the pixel chip 100). With this, even when the pixel chip 100 and the mounting substrate 200 expand due to temperature rise during the operation of the sensor unit 10, interference between the pixel chips 100 and the mounting substrates 200 of the adjacent sensor units 10 is prevented. Note that the protrusion amount of the pixel chip 100 with respect to the mounting substrate 200 is preferably equal to or greater than d, but may be less than d.

Figure 21A:
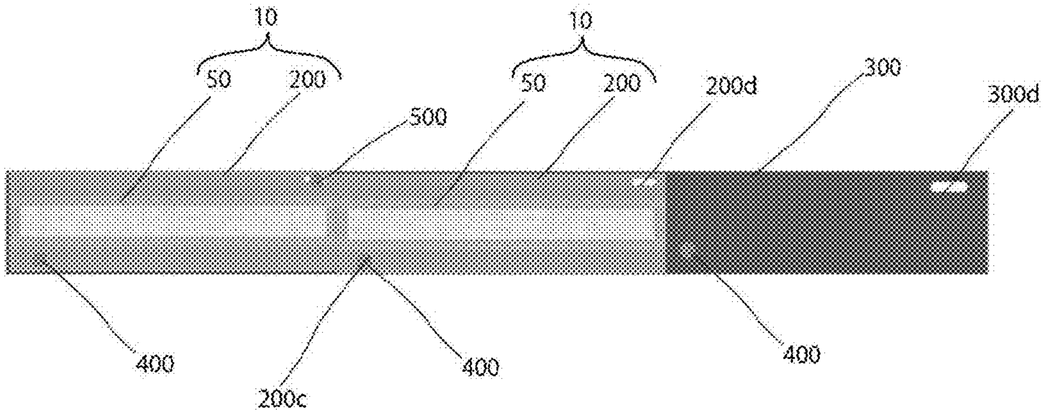
FIGS. 21A, 21B, and 21C are sectional views of the respective steps of the sensor unit mounting step.
Figure 21B:
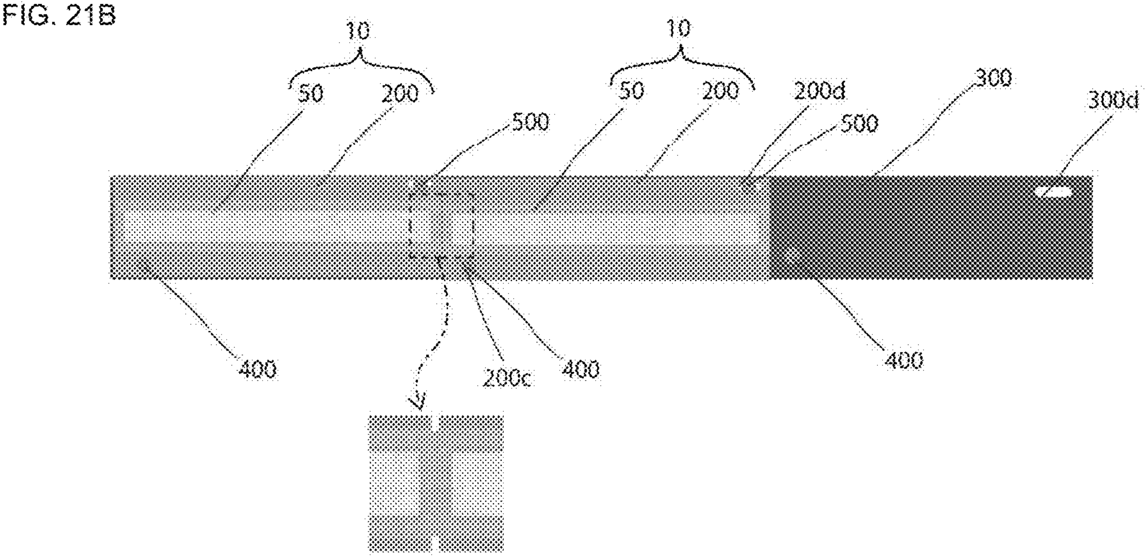
Figure 22A:
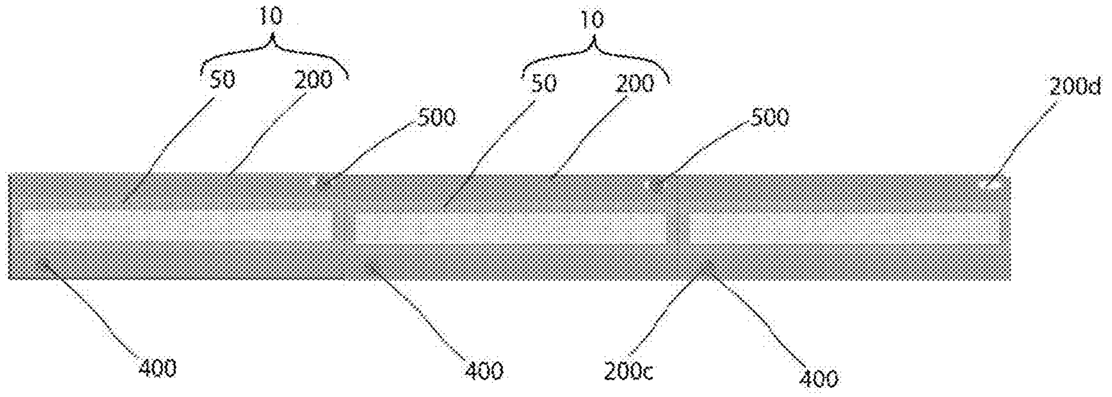
FIGS. 22A, 22B, and 22C are sectional views of the respective steps of the sensor unit mounting step.
Figure 22B:
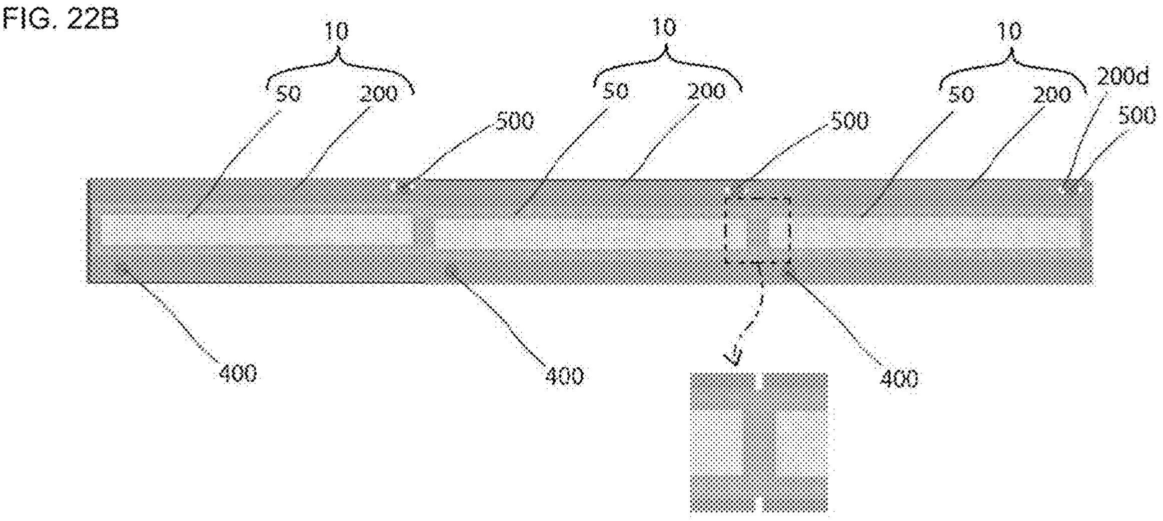

The two adjacent sensor units 10 are positioned with their adjacent end portions in the X-axis direction of the pixel chips 100 (the short sides of the rectangles) abutting against each other (see FIGS. 21B and 22B). With this, the positional relation between the adjacent pixel chips 100 is maintained properly.

(Translucent Cover)

The translucent cover 101 transmits visible light and/or non-visible light. The translucent cover 101 includes, for example, a short glass or resin plate. The translucent cover 101 is bonded (for example, adhered) to the semiconductor substrate 103 via the frame-shaped (for example, rectangular frame-shaped) spacer 102 surrounding the pixel region, for example.

It is preferable that there be some clearance between the adjacent end portions in the X-axis direction of the translucent covers 101 of the two adjacent sensor units 10. This is to prevent interference between the adjacent translucent covers 101 caused by the expansion of the translucent covers 101 due to temperature rise during device operation, for example.

(Spacer)

The spacer 102 contains, for example, an epoxy-based resin, a silicone-based resin, or the like. Specifically, the spacer 102 may be a photo spacer or contain a permanent resist of SU-8. A photo spacer or a spacer containing a permanent resist of SU-8 can be generated by forming a resist in the desired shape, size, and position by photolithography. Here, the spacer 102 is configured as a single frame-shaped body, but the spacer 102 may be configured with a plurality of spacer portions arranged in a frame shape as a whole, for example. The electrode pads described earlier are provided on the surface on the semiconductor substrate 103 side of the spacer 102.

In each of the sensor units 10, a sealed internal space is formed by the translucent cover 101, the spacer 102, and the pixel chip 100.

(Applications of Sensor Unit)

Each of the plurality of sensor units 10 may be a sensor unit for imaging. Specifically, the pixel chip 100 of each of the sensor units 10 may be a pixel chip for imaging. The pixel chip 100 for imaging preferably includes the pixels 100*a* that are highly sensitive to visible light (for example, at least one of red light, green light, and blue light). The translucent cover 101 of the sensor unit for imaging preferably transmits at least visible light (for example, at least one of red light, green light, and blue light, preferably only visible light).

Each of the plurality of sensor units 10 may also be a sensor unit for ranging (for example, TOF sensor). The sensor unit for ranging is used in combination with a light source for ranging (for example, non-visible light source). Specifically, the pixel chip 100 of each of the sensor units 10 may be a pixel chip for ranging. The pixel chip 100 for ranging preferably includes the pixels 100*a* that are highly sensitive to the emission wavelength of a light source for ranging (for example, infrared range). The translucent cover 101 of the sensor unit for ranging preferably transmits at least non-visible light (preferably only non-visible light).

The plurality of sensor units 10 may include both sensor units for imaging and sensor units for ranging.

Specifically, among the plurality of sensor units 10 including sensor units for imaging and sensor units for ranging, the pixel chip 100 of the sensor unit for imaging may be a pixel chip for imaging. The pixel chip 100 for imaging preferably includes the pixels 100*a* that are highly sensitive to visible light (for example, at least one of red light, green light, and blue light). The translucent cover 101 of the sensor unit for imaging preferably transmits only visible light (for example, at least one of red light, green light, and blue light). With this, cross-talk between the sensor units for ranging and the sensor units for imaging can be prevented.

Among the plurality of sensor units 10 including sensor units for imaging and sensor units for ranging, the pixel chip 100 of the sensor unit for ranging preferably includes the pixels 100*a* that are highly sensitive to the emission wavelength of a light source for ranging (for example, infrared range). The translucent cover 101 of the sensor unit for ranging preferably transmits only non-visible light. With this, cross-talk between the sensor units for imaging and the sensor units for ranging can be prevented.

(Positioning Structure)

The above-mentioned positioning structure includes, for example, as depicted in FIG. 5, FIG. 6, FIG. 10, FIG. 11, and FIG. 13, a pin 400 and a first bolt insertion hole 300*d* provided to the substrate 300, a pin insertion hole 200*c* which is provided in the mounting substrate 200 and into which the pin 400 is inserted, a second bolt insertion hole 200*d* provided at a position corresponding to the first bolt insertion hole 300*d* of the mounting substrate 200, a bolt 500 inserted through the first and second bolt insertion holes 300*d* and 200*d*, and a nut 600 threadedly engaged with the bolt 500. The pin 400 has, for example, one end-side (−Z-side) portion inserted and fixed to a pin insertion hole 300*c* provided in the substrate 300, and the other end-side (+Z-side) portion inserted through the pin insertion hole 200*c* provided in the mounting substrate 200. Here, the positioning structure is laid out such that, for example, the pin 400 and the bolt 500 are positioned on a diagonal line of the sensor unit 10 and the substrate 300 (see FIG. 1).

The pin insertion hole 200*c* is a round hole into which the pin 400 is fitted, as depicted in FIG. 7, and the first and second bolt insertion holes 300*d* and 200*d* are elongated holes with a length in the transverse direction greater than the diameter of screw portion of the bolt 500. With this, for example, by applying a rotational moment around the pin 400 to the sensor unit 10 with the bolt 500 loosely fixed with the nut 600, the sensor unit 10 can be rotated around the pin 400 within the range corresponding to the movable range of the bolt 500 within the elongated holes.

Note that, in the positioning structure in question, the pin and the first bolt insertion hole may be provided to the mounting substrate 200, the pin insertion hole into which the pin is inserted may be provided in the substrate 300, and the second bolt insertion hole may be provided at a position corresponding to the first bolt insertion hole of the substrate 300.

<<Method of Manufacturing Image Sensor Device>>

Figure 15:
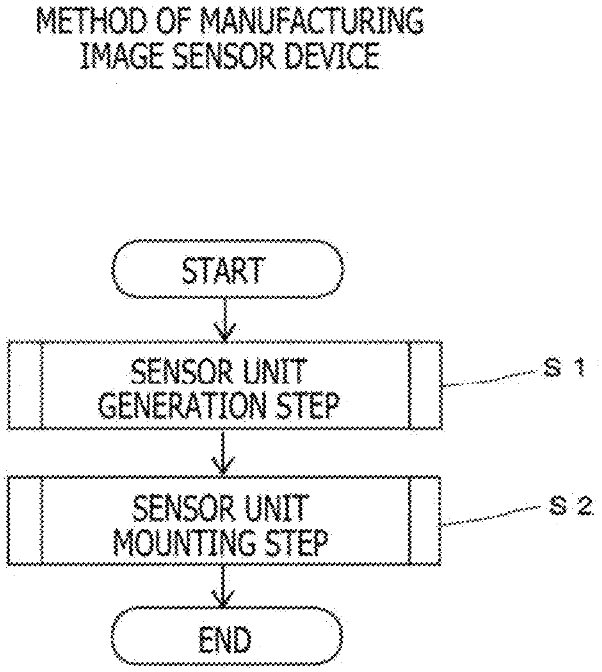
FIG. 15 is a flowchart depicting a method of manufacturing the image sensor device according to the embodiment of the present technology.

Now, a method of manufacturing the image sensor device 1 according to the embodiment of the present technology is described with reference to a flowchart of FIG. 15.

Figure 16:
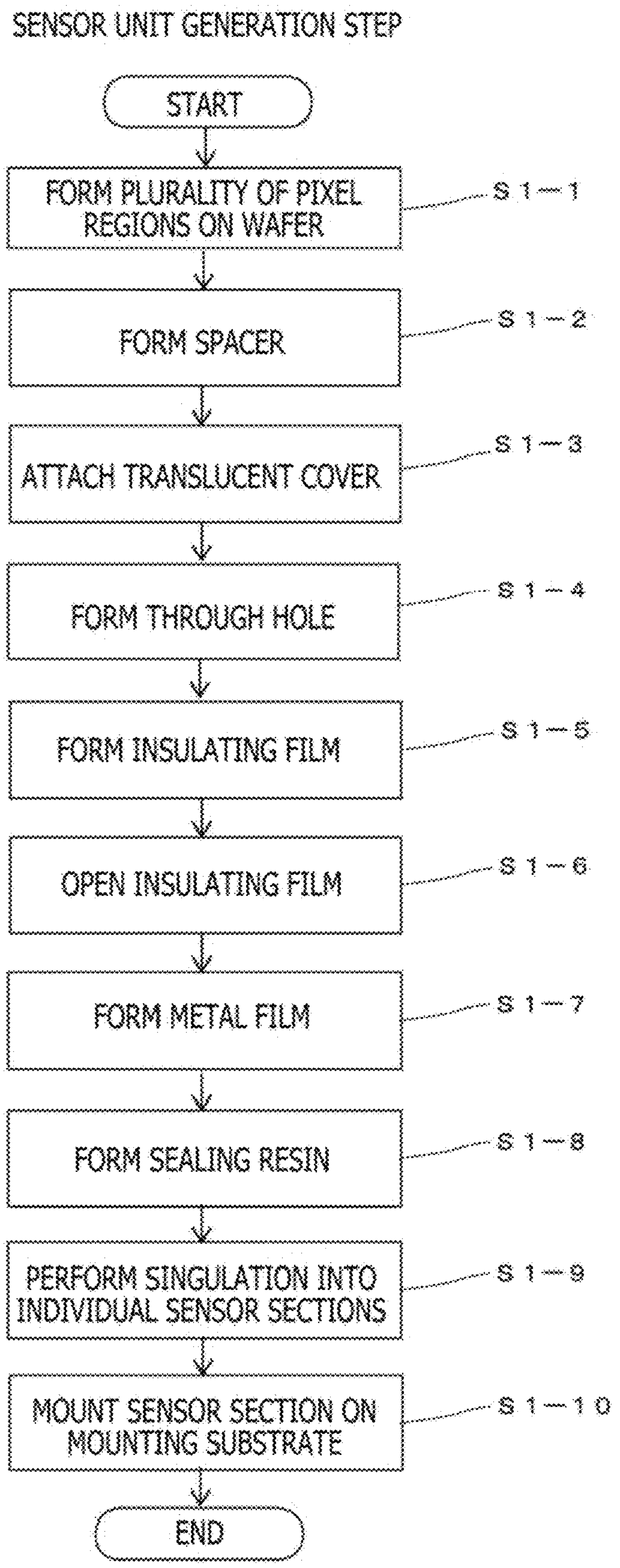
FIG. 16 is a flowchart depicting a sensor unit generation step.

In the first step S1, a sensor unit generation step (see FIG. 16) is performed. The details of the sensor unit generation step are described later.

Figure 17:
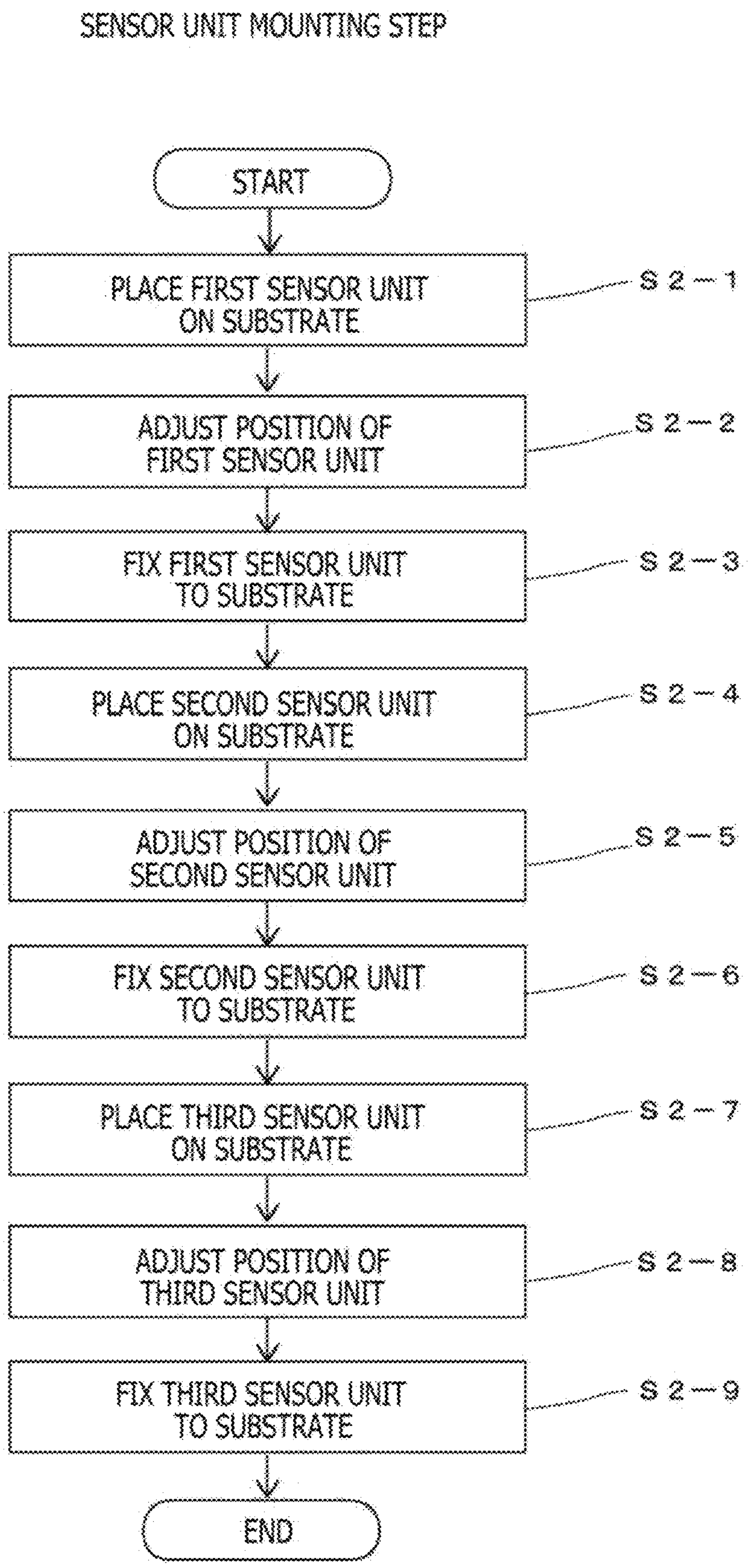
FIG. 17 is a flowchart depicting a sensor unit mounting step.
Figure 18A:
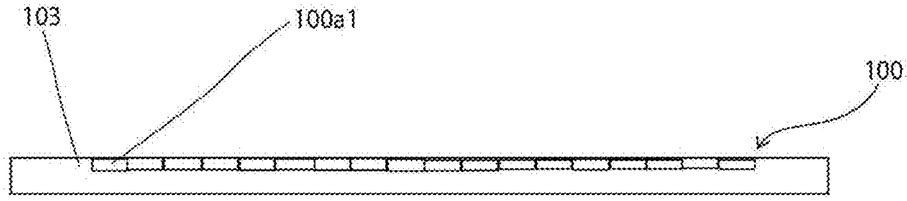
FIGS. 18A, 18B, 18C, 18D, and 18E are sectional views of the respective steps of the sensor unit generation step.
Figure 18B:
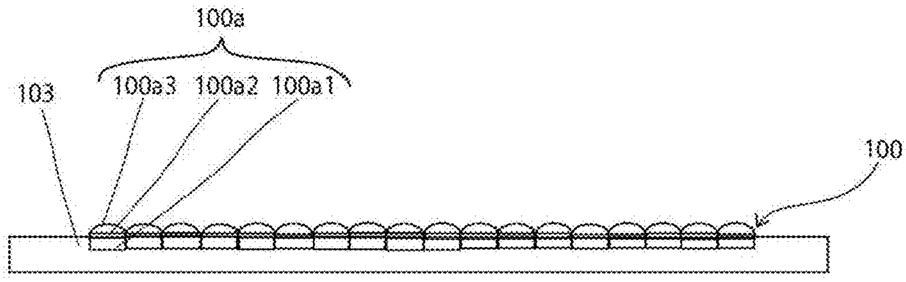
Figure 18C:
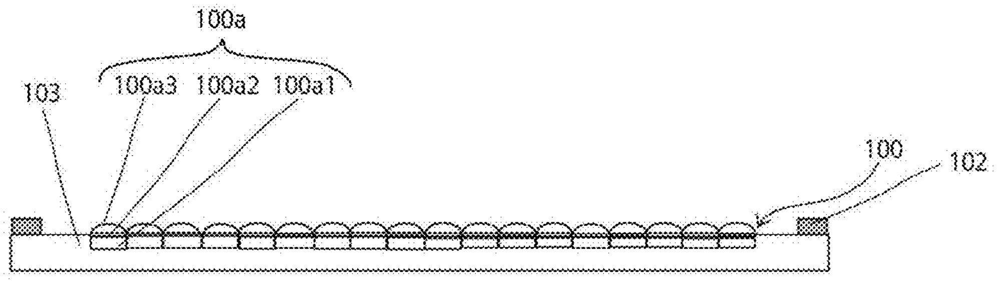
Figure 18D:
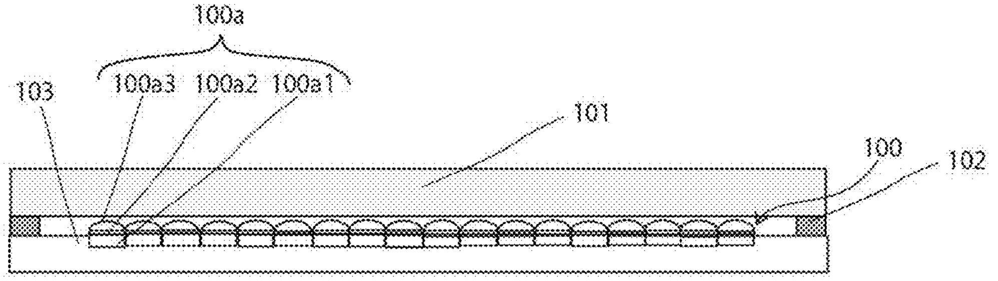
Figure 18E:
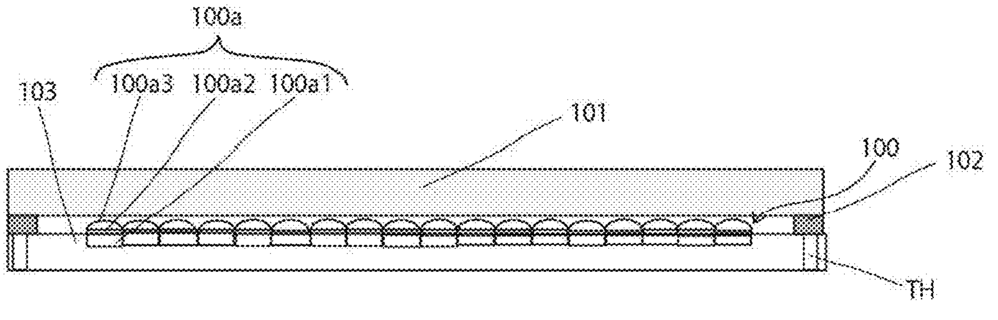
Figure 19A:
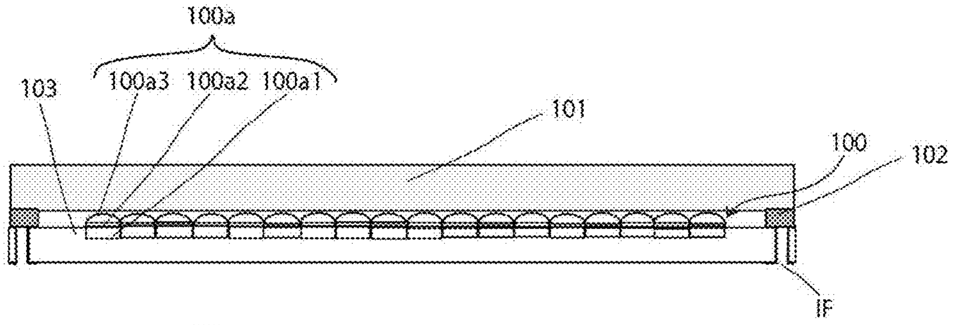
FIGS. 19A, 19B, 19C, and 19D are sectional views of the respective steps of the sensor unit generation step.
Figure 19B:
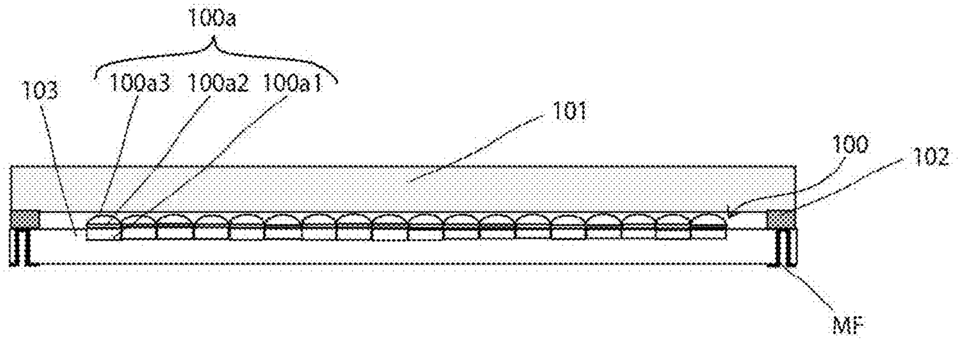
Figure 19C:
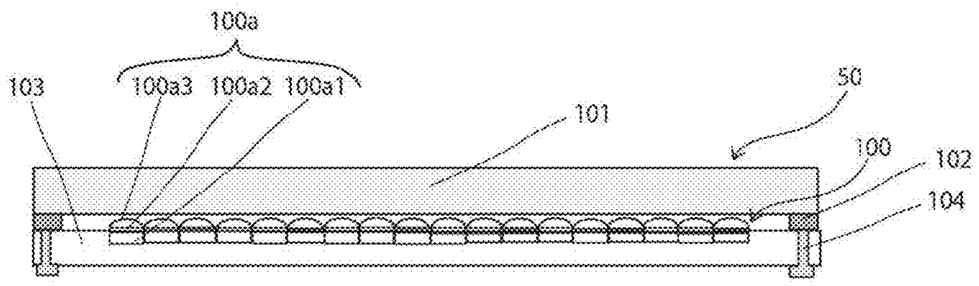
Figure 19D:
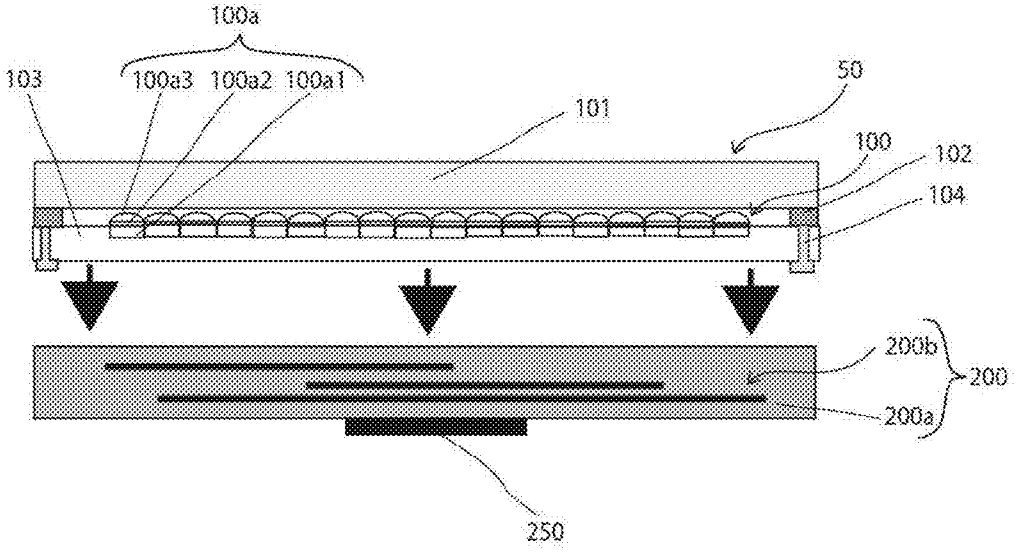

In the last step S2, a sensor unit mounting step (see FIG. 17) is performed. The details of the sensor unit mounting step are described later.

(Sensor Unit Generation Step)

Now, the sensor unit generation step (step S1 of FIG. 15) is described with reference to a flowchart of FIGS. 16, 18A, 18B, 18C, 18D, 18E, 19A, 19B, 19C, and 19D.

In the first step S1-1, a plurality of pixel regions are formed on a wafer. Specifically, first, by photolithography, on a wafer serving as a base material for the semiconductor substrate 103 on which each pixel region is formed, the plurality of photoelectric conversion elements 100*a*1 serving as the pixel regions are formed (see FIG. 18A). Next, the color filter 100*a*2 and the micro lens 100*a*3 are formed on each of the photoelectric conversion elements 100*a*1 in this order (see FIG. 18B).

In the next step S1-2, the spacer 102 is formed. Specifically, the frame-shaped spacer 102 is formed on each of the semiconductor substrates 103 to surround the pixel region by photolithography, for example (see FIG. 18C).

In the next step S1-3, the translucent cover 101 is attached. Specifically, the outer edge portion of the translucent cover 101 is bonded to the spacer 102 formed on each of the semiconductor substrates 103, via an adhesive, for example (see FIG. 18D).

In the next step S1-4, a through hole TH is formed. Specifically, the through hole TH is formed at a position corresponding to the electrode pad of the semiconductor substrate 103 by photolithography, for example (see FIG. 18E).

In the next step S1-5, an insulating film IF is deposited. Specifically, the insulating film IF containing, for example, $SiO_2$ is deposited in the through hole TH and the surrounding portion thereof.

In the next step S1-6, the insulating film IF is opened. A portion of the insulating film IF formed at the bottom portion of the through hole TH is removed by etching to open the insulating film IF, thereby exposing the electrode pad (see FIG. 19A).

In the next step S1-7, a metal film MF is formed. Specifically, first, a barrier layer is formed on the insulating film IF on which the electrode pad is exposed. Next, Cu plating is performed using this barrier layer as a seed (see FIG. 19B). As a result, the metal film MF including a via having one end connected to the electrode pad and a land connected to the other end of the via is formed.

In the next step S1-8, a sealing resin is formed. Specifically, the portion of the metal film MF within the through hole TH (via) and the portion of the metal film MF on the surrounding portion of the through hole TH (land) are sealed with resin (see FIG. 19C). With this, the through electrode 104 is completed. As a result, the plurality of sensor sections 50 are generated integrally.

In the next step S1-9, singulation into the individual sensor sections 50 is performed. Specifically, by dicing, the plurality of sensor sections 50 formed integrally are separated for each of the sensor sections 50.

In the last step S1-10, the sensor section 50 is mounted on the mounting substrate 200. Specifically, the surface on the semiconductor substrate 103 side of the sensor section 50 is opposed to the mounting surface (surface provided with lands) of the mounting substrate 200, and the lands of the through electrodes 104 are bonded to the lands of the mounting substrate 200 via metal bumps (for example, solder balls) (see FIG. 19D). As a result, the sensor unit 10 (see FIG. 8) is generated.

(Sensor Unit Mounting Step)

Now, the sensor unit mounting step (step S2 of FIG. 15) is described with reference to a flowchart of FIGS. 17, 20A, 20B, 20C, 21A, 21B, 21C, 22A, 22B, and 22C. Here, the plurality of (for example, three) sensor units 10 are referred to as "first to third sensor units 10-1 to 10-3."

Figure 20A:
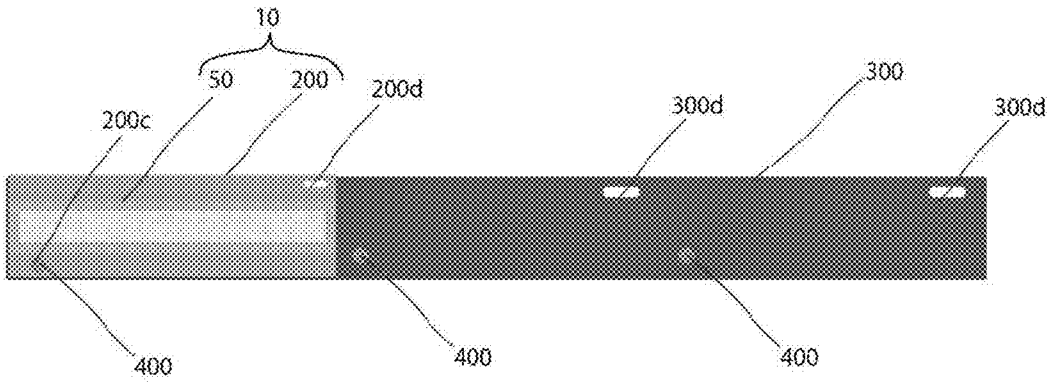
FIGS. 20A, 20B, and 20C are sectional views of the respective steps of the sensor unit mounting step.

In the first step S2-1, the first sensor unit 10-1 is placed on the substrate 300 (see FIG. 20A). Specifically, the first sensor unit 10-1 is placed such that the pin 400 is inserted into the pin insertion hole 200*c* on one end portion in the longitudinal direction of the substrate 300, and that the connectors 250 of the first sensor unit 10-1 are connected to connector connection portions provided to the substrate 300.

Figure 20B:
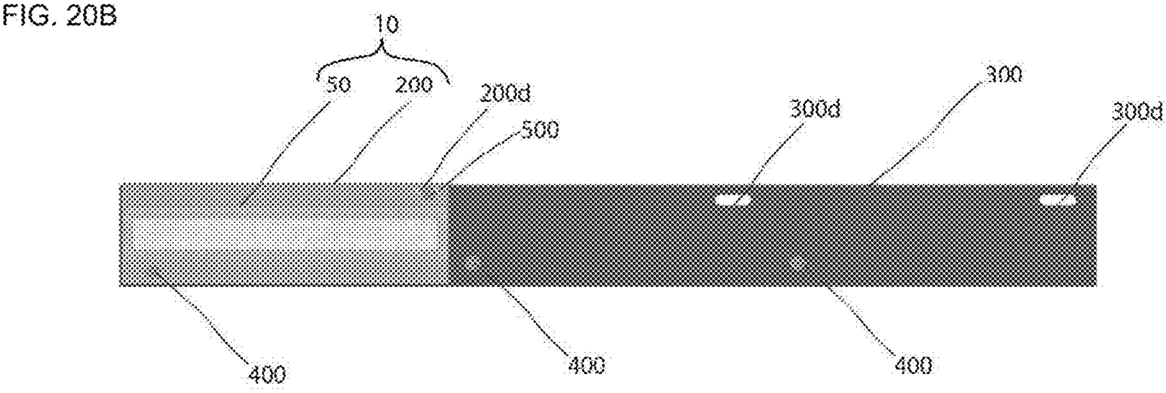
Figure 20C:

In the next step S2-2, the position of the first sensor unit 10-1 is adjusted (see FIGS. 20B and 20C). Specifically, first, the bolt 500 is inserted through the first bolt insertion hole 300*d* of the substrate 300 and the second bolt insertion hole 200*d* of the first sensor unit 10-1. The nut 600 is threadedly engaged with the bolt 500 to temporarily tighten the nut 600. Next, the first sensor unit 10-1 is rotated around the pin 400 to perform position adjustment with respect to the substrate 300. The position adjustment of the first sensor unit 10-1 may be relatively rough.

In the next step S2-3, the first sensor unit 10-1 is fixed to the substrate 300. Specifically, the nut 600 threadedly engaged with the bolt 500 is tightened to fully tighten the nut 600 while the state after the position adjustment in step S2-2 is maintained.

In the next step S2-4, the second sensor unit 10-2 is placed on the substrate 300 (see FIG. 21A). Specifically, the second sensor unit 10-2 is placed such that the pin 400 is inserted into the pin insertion hole 200*c* on the intermediate portion in the longitudinal direction of the substrate 300, and that the connectors 250 of the second sensor unit 10-2 are connected to connector connection portions provided to the substrate 300.

Figure 21C:
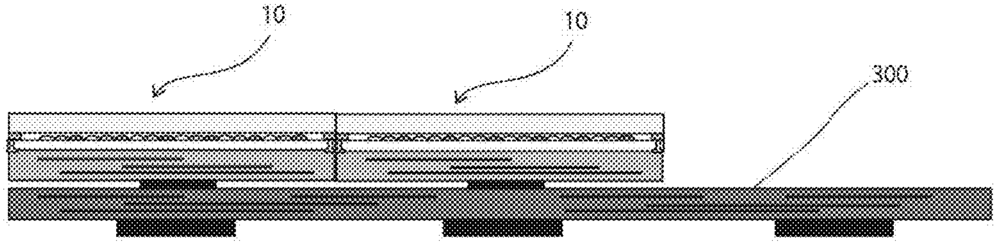

In the next step S2-5, the position of the second sensor unit 10-2 is adjusted (see FIGS. 21B and 21C). Specifically, first, the bolt 500 is inserted through the first bolt insertion hole 300*d* of the substrate 300 and the second bolt insertion hole 200*d* of the second sensor unit 10-2. The nut 600 is threadedly engaged with the bolt 500 to temporarily tighten the nut 600. Next, the second sensor unit 10-2 is rotated around the pin 400 to perform position adjustment with respect to the substrate 300. At this time, the position of the second sensor unit 100-2 is adjusted such that the end surface of the pixel chip 100 of the second sensor unit 10-2 abuts against the end surface of the pixel chip 100 of the first sensor unit 10-1 (see the partial enlarged view of FIG. 21B).

In the next step S2-6, the second sensor unit 10-2 is fixed to the substrate 300. Specifically, the nut 600 threadedly engaged with the bolt 500 is tightened to fully tighten the nut 600 while the state after the position adjustment in step S2-5 is maintained.

In the next step S2-7, the third sensor unit 10-3 is placed on the substrate 300 (see FIG. 22A). Specifically, the third sensor unit 10-3 is placed such that the pin 400 is inserted into the pin insertion hole 200*c* on the other end portion in the longitudinal direction of the substrate 300, and that the connectors 250 of the third sensor unit 10-3 are connected to connector connection portions provided to the substrate 300.

Figure 22C:
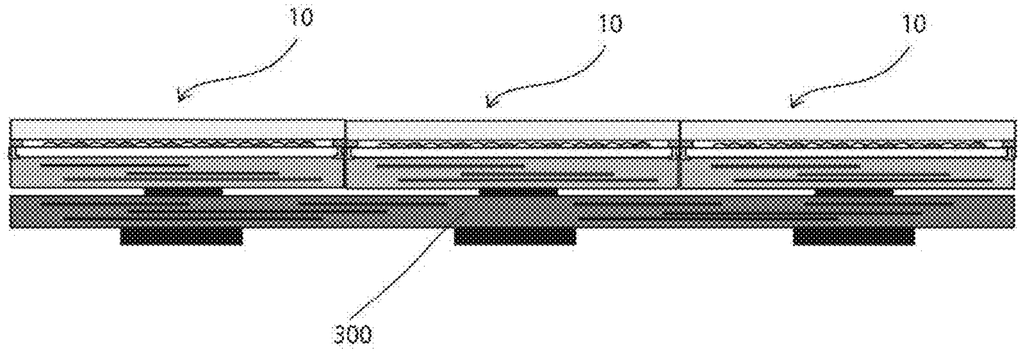

In the next step S2-8, the position of the third sensor unit 10-3 is adjusted (see FIGS. 22B and 22C). Specifically, first, the bolt 500 is inserted through the first bolt insertion hole 300*d* of the substrate 300 and the second bolt insertion hole 200*d* of the third sensor unit 10-3. The nut 600 is threadedly engaged with the bolt 500 to temporarily tighten the nut 600. Next, the third sensor unit 10-3 is rotated around the pin 400 to perform position adjustment with respect to the substrate 300. At this time, the position of the third sensor unit 100-3 is adjusted such that the end surface of the pixel chip 100 of the third sensor unit 10-3 abuts against the end surface of the pixel chip 100 of the second sensor unit 10-2 (see the partial enlarged view of FIG. 22B).

In the last step S2-9, the third sensor unit 10-3 is fixed to the substrate 300. Specifically, the nut 600 threadedly engaged with the bolt 500 is tightened to fully tighten the nut 600 while the state after the position adjustment in step S2-8 is maintained.

In the manner described above, the image sensor device 1 in which the positional relation between the sensor units 10 has been properly adjusted is manufactured.

<<Effects of Image Sensor Device and Method of Manufacturing Same>>

As described below, the image sensor device 1 according to the embodiment of the present technology includes the substrate 300, and the plurality of sensor units 10 arranged in at least one axis direction (for example, X-axis direction) on the substrate 300, and each of the plurality of sensor units 10 includes the pixel chip 100 including the plurality of pixels 100*a*, and the translucent cover 101 configured to cover the pixel chip 100.

With the image sensor device 1, the translucent cover 101 is provided for each of the pixel chips 100, so that there can be provided an image sensor device that can reduce the risks of damage to and/or contamination of the components during manufacturing.

The plurality of sensor units 10 may be arranged in one axis direction (for example, X-axis direction). Moreover, the substrate 300 and each of the plurality of sensor units 10 have longitudinal directions that substantially match the one axis direction (X-axis direction). With this, the image sensor device 1 can form a linear image sensor.

The translucent cover 101 can have a plate shape, and each of the plurality of sensor units 10 can further include the spacer 102 disposed between the pixel chip 100 and the translucent cover 101. With this, the internal space for each of the pixel chips 100 can be easily formed using the plate-shaped translucent cover 101.

Since the translucent cover 101 provided for each of the pixel chips 100 is short, the peel-off of the translucent cover 101 due to a mismatch in linear expansion coefficient with the semiconductor substrate 103 and a deterioration in image quality due to the warping of the pixel chip 100 can be prevented.

Since the translucent cover 101 is short, the risk of damage to the translucent cover 101 and the pixel chip 100 during handling in the sensor unit 10 is low.

Since there is no need to make the pixel chip 100 long, a large-diameter wafer is not required, resulting in cost reduction.

Each of the plurality of sensor units 10 can further include the mounting substrate 200 on which the pixel chip 100 is mounted. With this, the sensor unit 10 including the pixel chip 100 can be easily mounted on the substrate 300.

The pixel chip 100 preferably protrudes on at least one side in one axis direction (for example, X-axis direction) with respect to the mounting substrate 200.

The pixel chip 100 preferably protrudes on at least one side in one axis direction (for example, X-axis direction) with respect to the mounting substrate 200 by at least an amount corresponding to the difference between the linear expansion coefficient of the pixel chip 100 and the linear expansion coefficient of the mounting substrate 200.

The positioning structure configured to position the substrate 300 and a corresponding one of the plurality of sensor units 10 is preferably provided. With this, position adjustment between the sensor units can be achieved.

The positioning structure in question may include the pin 400 and the first bolt insertion hole provided to one of the substrate 300 and the mounting substrate 200, the pin insertion hole which is provided in the other of the substrate 300 and the mounting substrate 200 and into which the pin 400 is inserted, the second bolt insertion hole provided at a position corresponding to the first bolt insertion hole of the other of the substrate 300 and the mounting substrate 200, the bolt 500 inserted through the first and second bolt insertion holes, and the nut 600 threadedly engaged with the bolt 500. With this, by a simple configuration, the position of each of the sensor units 10 around the axis vertical to the substrate 300 can be adjusted.

The pin insertion hole is preferably a round hole into which the pin 400 is fitted, and the first and second bolt insertion holes are preferably elongated holes with a length in the transverse direction greater than the diameter of the screw portion of the bolt. With this, the position of each of the sensor units 10 around the axis vertical to the substrate 300 can be easily adjusted.

The pixel chip 100 may include the semiconductor substrate 103 serving as a pixel substrate with a pixel region in which a plurality of pixels are provided, and the pixel substrate 103 may be provided with the through electrodes 104 for electrically connecting the electrode pads provided on the opposite side of the mounting substrate 200 side of the pixel substrate 103 to the mounting substrate 200.

Each of the plurality of sensor units 10 may be the sensor unit 10 for imaging.

Each of the plurality of sensor units 10 may be the sensor unit 10 for ranging.

The plurality of sensor units 10 may include sensor units for imaging and sensor units for ranging. With this, both imaging and ranging can be performed in parallel, or imaging and ranging can be performed selectively (for example, alternately), with use of the image sensor device 1.

In such a way, in the image sensor device 1, the sensor units 10 different in performance and/or applications are combined to allow a single packaged device to have a plurality of functions.

The method of manufacturing the image sensor device 1 according to the embodiment of the present technology includes a step of generating the plurality of sensor units 10 each including the pixel chip 100 and the translucent cover 101 configured to cover the pixel chip 100, and a step of arranging and mounting the plurality of sensor units 10 in at least one axis direction on the substrate 300. With this, the translucent cover 101 is provided for each of the pixel chips 100, so that there can be manufactured an image sensor device that can reduce the risks of damage to and/or contamination of the components during manufacturing.

The above-mentioned step of mounting may involve fixing, after adjusting the position of each of the sensor units 10 with respect to the substrate 300, the sensor units 10 to the substrate 300. With this, the image sensor device 1 in which the positional relation between the pixel chips 100 has been properly adjusted can be manufactured.

With the method of manufacturing the image sensor device 1, hollow structures can be formed in the wafer process, so that it is possible to prevent contamination of the surfaces of the pixel chips 100.

Meanwhile, in the related art (for example, PTL 1), there are such problems as the following (1) to (6).

(1) The position of the sensor unit including the sensor chip and the sensor substrate is determined depending on the processing accuracy of the sensor unit, and hence, the position of the sensor unit cannot be adjusted.

(2) Wire bonding is performed to assemble the frame, the cover glass, and the like after all sensor units are held on the substrate holder, and hence, there is a high risk of contamination of the sensor surface.

(3) The cover glass is long, and hence, there is a high risk of damage to the cover glass during handling.

(4) The sensor chip protrudes alone during handling, and hence, there is a high risk of chip damage.

(5) In addition to the substrate holder, a plurality of types of substrates for positioning are required, and hence, the number of components is high and the positioning structure is complex.

(6) It is difficult to select materials that achieve a cover glass and a substrate holder that have close linear expansion coefficients, and hence, such risks as the warping of the sensor surface due to the warping of the substrate holder and the peel-off of the glass are high.

2. Image Sensor Devices According to Modified Examples 1 to 9 of Present Technology Now, image sensor devices according to Modified Examples 1 to 9 of the present technology are described using the drawings. In the description of each modified example, points different from the above-mentioned embodiment are mainly described, and members having the same configurations are denoted by the same reference signs to omit the description thereof.

Image Sensor Device According to Modified Example 1

Figure 23A:
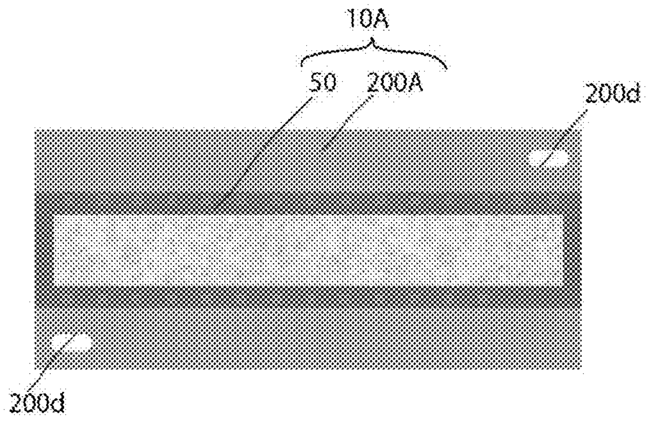
FIG. 23A is a plan view of a sensor unit of an image sensor device according to Modified Example 1 of the present technology.
Figure 23B:
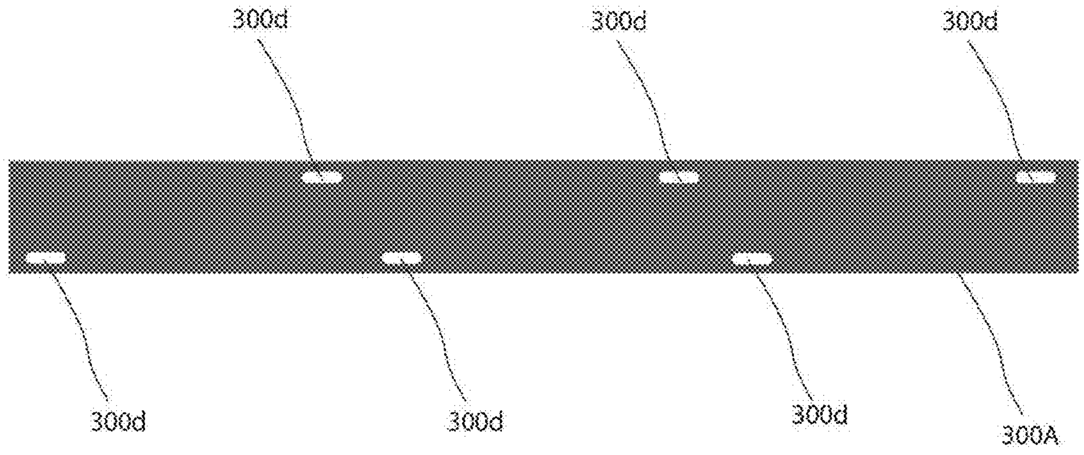
FIG. 23B is a plan view of a substrate of the image sensor device according to Modified Example 1 of the present technology.

In an image sensor device according to Modified Example 1, as depicted in FIGS. 23A and 23B, a mounting substrate 200A of a sensor unit 10A including the sensor section 50 and the mounting substrate 200A has the second bolt insertion hole 200*d* instead of the pin insertion hole 200*c*, and a substrate 300A has the first bolt insertion hole 300*d* instead of the pin insertion hole 300*c*.

The mounting substrate 200A has the two second bolt insertion holes 200*d* on a diagonal line.

The substrate 300A has the two first bolt insertion holes 300*d* on a diagonal line of the attachment section to which a corresponding one of the sensor units 10A is attached (at positions corresponding to the two respective second bolt insertion holes 200*d*).

In the image sensor according to Modified Example 1, the bolt 500 is inserted through the first and second bolt insertion holes 300*d* and 200*d* corresponding to each other, and the nut 600 is threadedly engaged with the screw portion of the bolt 500.

In the image sensor device according to Modified Example 1, the positioning structure includes the plurality of (for example, two) first bolt insertion holes provided in one of the substrate 300A and the mounting substrate 200A, the plurality of (for example, two) second bolt insertion holes provided at respective positions corresponding to the plurality of (for example, two) first bolt insertion holes of the other of the substrate 300A and the mounting substrate 200A, the plurality of (for example, two) bolts 500 inserted through respective ones of the plurality of sets of the first and second bolt insertion holes corresponding to each other, and the plurality of (two) nuts 600 threadedly engaged with respective ones of the plurality of bolts 500.

With the image sensor device according to Modified Example 1, the degree of freedom in adjusting the position of each of the sensor units 10A with respect to the substrate 300A is high. Further, each of the sensor units 10A can be fixed more firmly as being fixed to the substrate 300A at two points.

Image Sensor Device According to Modified Example 2

Figure 24:
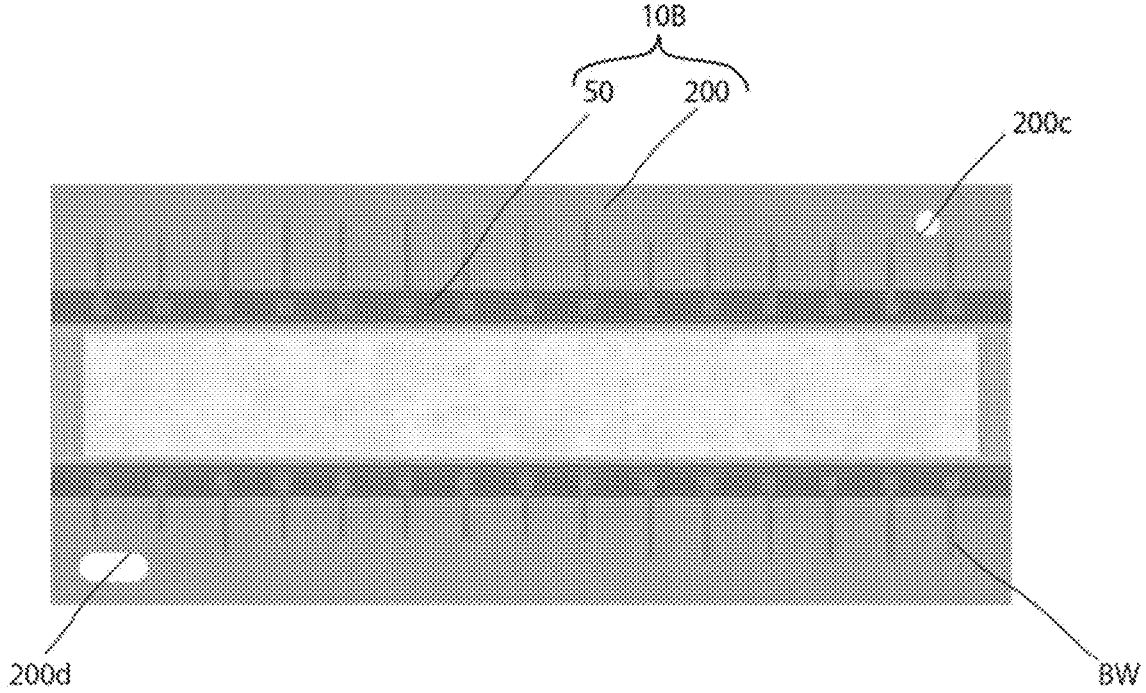
FIG. 24 is a plan view of a sensor unit of an image sensor device according to Modified Example 2 of the present technology.

In an image sensor device according to Modified Example 2, as depicted in FIG. 24, in a sensor unit 10B including the sensor section 50 and the mounting substrate 200, the electrode pad portions of the pixel chip 100 are electrically connected to the electrode pad portions of the mounting substrate 200 via bonding wires BW instead of the through electrodes 104.

Image Sensor Device According to Modified Example 3

Figure 25A:
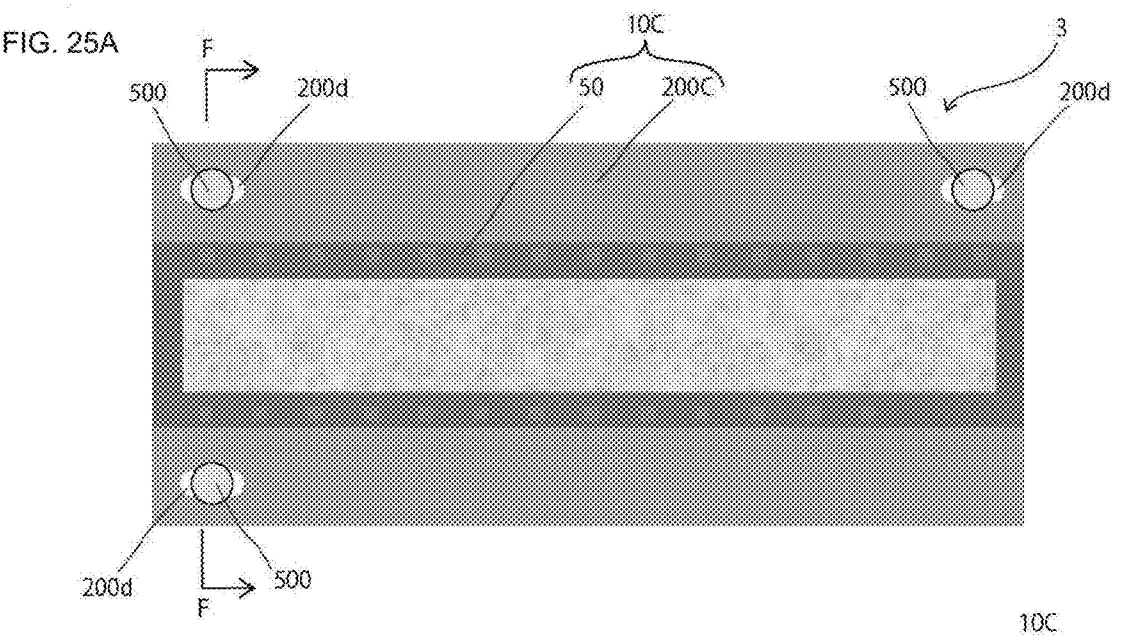
FIG. 25A is a plan view of a sensor unit of an image sensor device according to Modified Example 3 of the present technology.
Figure 25B:
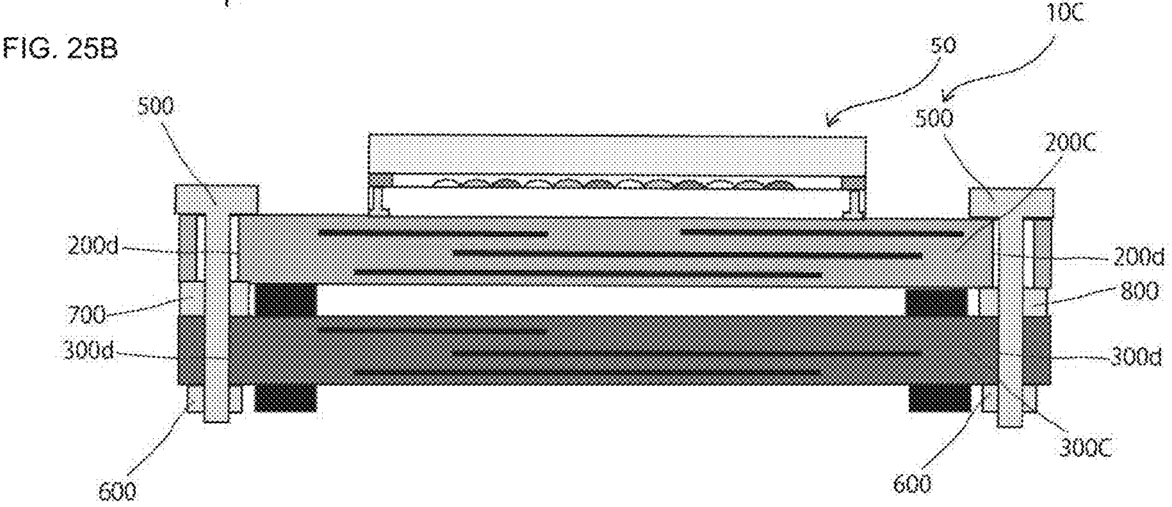
FIG. 25B is a sectional view along a line F-F of FIG. 25A (part 1).
Figure 25C:
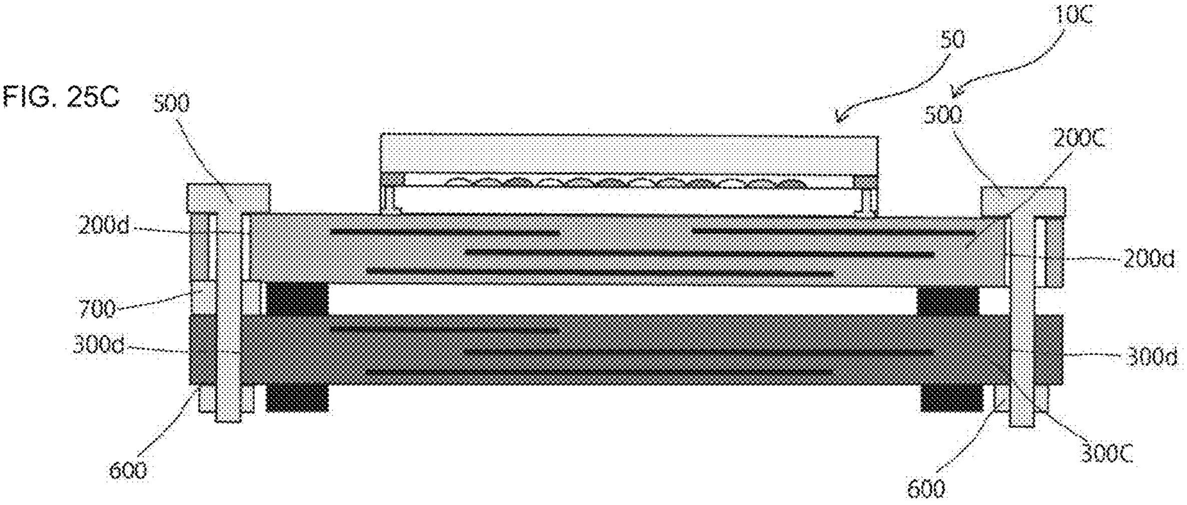
FIG. 25C is a sectional view along the line F-F of FIG. 25A (part 2).

An image sensor device 3 according to Modified Example 3 has, as depicted in FIGS. 25A, 25B, and 25C, a configuration generally similar to that of the image sensor device according to Modified Example 1 except that the additional second bolt insertion hole 200*d* is provided in a mounting substrate 200C of a sensor unit 10C, and that the additional first bolt insertion hole 300*d* is provided in a substrate 300.

In the image sensor device 3, the second bolt insertion holes 200*d* are provided at three positions not on the same straight line of the mounting substrate 200C, and the three first bolt insertion holes 300*d* are provided at positions corresponding to the positions of the three second bolt insertion holes 200*d* of a substrate 300C.

In detail, in the image sensor device 3, for example, as depicted in FIG. 25B, which is an example of a sectional view along the line F-F of FIG. 25A, one of the two bolts 500 arranged in the transverse direction of the sensor unit 10C is inserted through a spacer 700 disposed between the mounting substrate 200C and the substrate 300C, and the other bolt 500 is inserted through a spacer 800 disposed between the mounting substrate 200C and the substrate 300C. In this case, with the thicknesses of the spacers 700 and 800, the inclination in the transverse and longitudinal directions of the sensor unit 10C with respect to the substrate 300C can be adjusted to the desired inclination.

The image sensor device 3 may include the spacer 700 and may not include the spacer 800, for example, as depicted in FIG. 25C, which is another example of the sectional view along the line F-F of FIG. 25A. In this case, with the thickness of the spacer 700, the inclination in the transverse and longitudinal directions of the sensor unit 10C with respect to the substrate 300C can be adjusted.

Moreover, in the examples of FIGS. 25B and 25C, the other bolt 500 of the sensor unit 10C may be inserted through a spacer disposed between the mounting substrate 200C and the substrate 300C.

As described above, in the image sensor device 3, at least three sets (for example, three sets) of the first and second bolt insertion holes are provided, the bolt 500 includes at least three (for example, three) bolts corresponding to the at least three sets (for example, three sets), and the positioning structure includes the spacer through which a corresponding one of the at least three (for example, three) bolts 500 is inserted and which is disposed between the substrate 300C and the mounting substrate 200C.

Image Sensor Device According to Modified Example 4

Figure 26A:
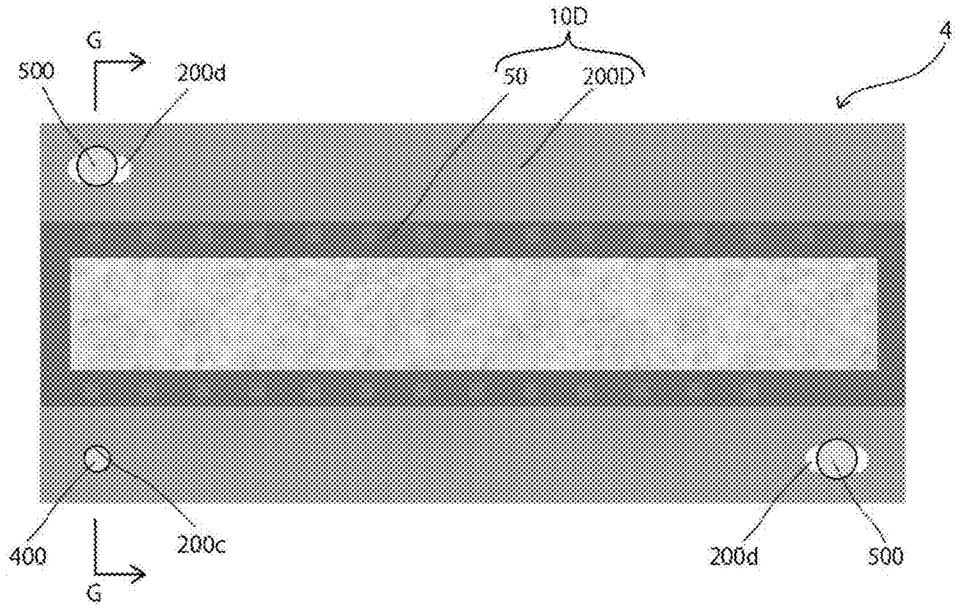
FIG. 26A is a plan view of a sensor unit of an image sensor device according to Modified Example 4 of the present technology.
Figure 26B:
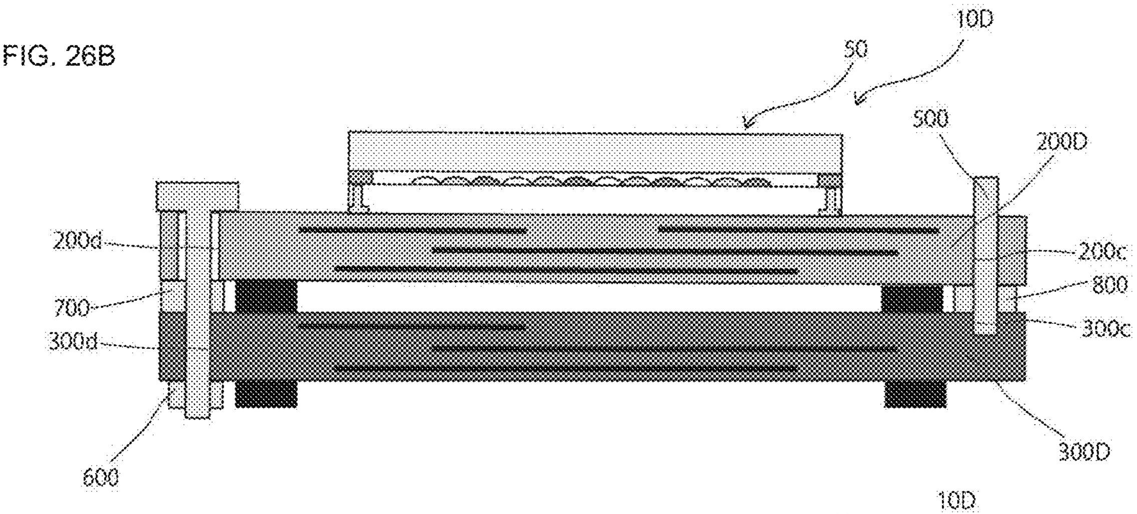
FIG. 26B is a sectional view along a line G-G of FIG. 26A (part 1).
Figure 26C:
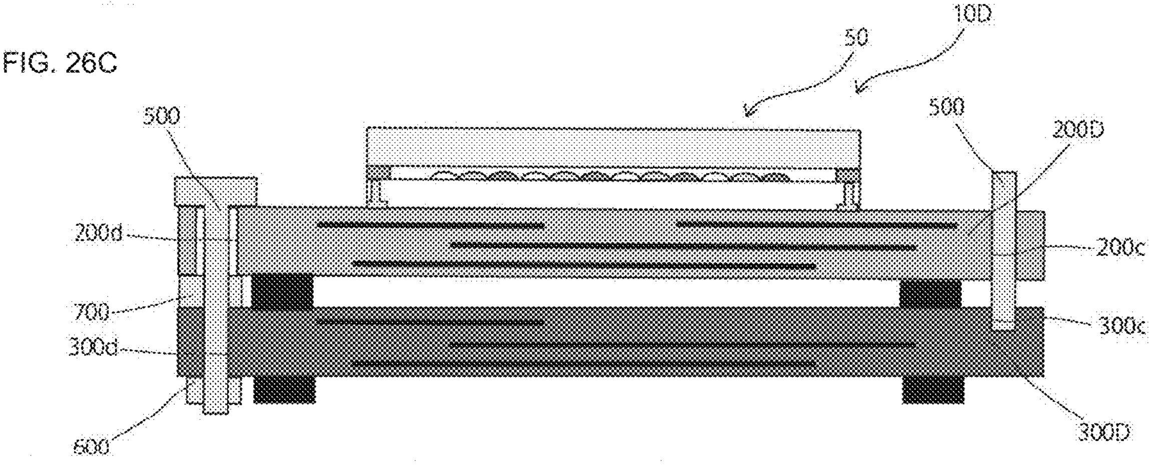
FIG. 26C is a sectional view along the line G-G of FIG. 26A (part 2).

In an image sensor device 4 according to Modified Example 4, for example, as depicted in FIGS. 26A, 26B, and 26C, the two second bolt insertion holes 200*d* are provided at respective two out of three positions not on the same straight line of a mounting substrate 200D of a sensor unit 10D, and the pin insertion hole 200*c* is provided at one position. The two first bolt insertion holes 300*d* are provided at positions corresponding to the two second bolt insertion holes 200*d* of a substrate 300D, and the pin insertion hole 300*c* to which the pin 400 is inserted and fixed is provided at a position corresponding to the pin insertion hole 200*c* of the substrate 300D.

In detail, in the image sensor device 4, for example, as depicted in FIG. 26B, which is an example of a sectional view along the line G-G of FIG. 26A, among the bolt 500 and the pin 400 arranged in the transverse direction of the sensor unit 10D, the bolt 500 is inserted through the spacer 700 disposed between the mounting substrate 200D and the substrate 300D, and the pin 400 is inserted through the spacer 800 disposed between the mounting substrate 200D and the substrate 300D. In this case, with the thicknesses of the spacers 700 and 800, the inclination in the transverse and longitudinal directions of the sensor unit 10D with respect to the substrate 300D can be adjusted to the desired inclination.

The image sensor device 4 may include the spacer 700 and may not include the spacer 800, for example, as depicted in FIG. 26C, which is another example of the sectional view along the line G-G of FIG. 26A. In this case, with the thickness of the spacer 700, the inclination in the transverse and longitudinal directions of the sensor unit 10D with respect to the substrate 300D can be adjusted.

Moreover, in the examples of FIGS. 26B and 26C, the other bolt 500 of the sensor unit 10D may be inserted through a spacer disposed between the mounting substrate 200D and the substrate 300D.

As described above, in the image sensor device 4, the plurality of sets (for example, two sets) of first and second bolt insertion holes are provided, the bolt 500 includes a plurality of (for example, two) bolts corresponding to the plurality of sets (for example, two sets), and the positioning structure includes the spacer through which a corresponding one of the plurality of bolts 500 is inserted and which is disposed between the substrate 300D and the mounting substrate 200D.

Image Sensor Device According to Modified Example 5

Figure 27A:
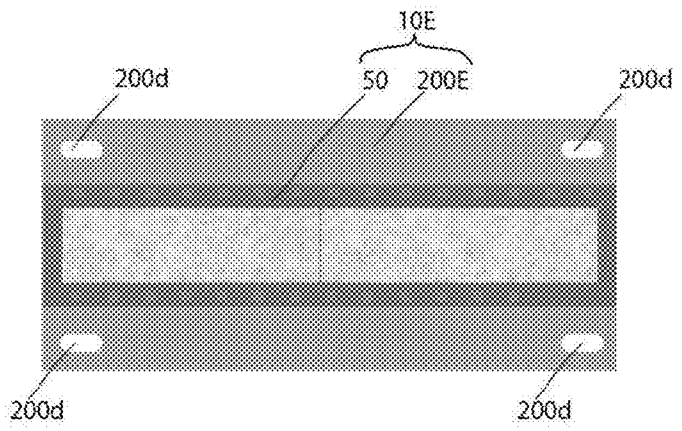
FIG. 27A is a plan view of a sensor unit of an image sensor device according to Modified Example 5 of the present technology.
Figure 27B:
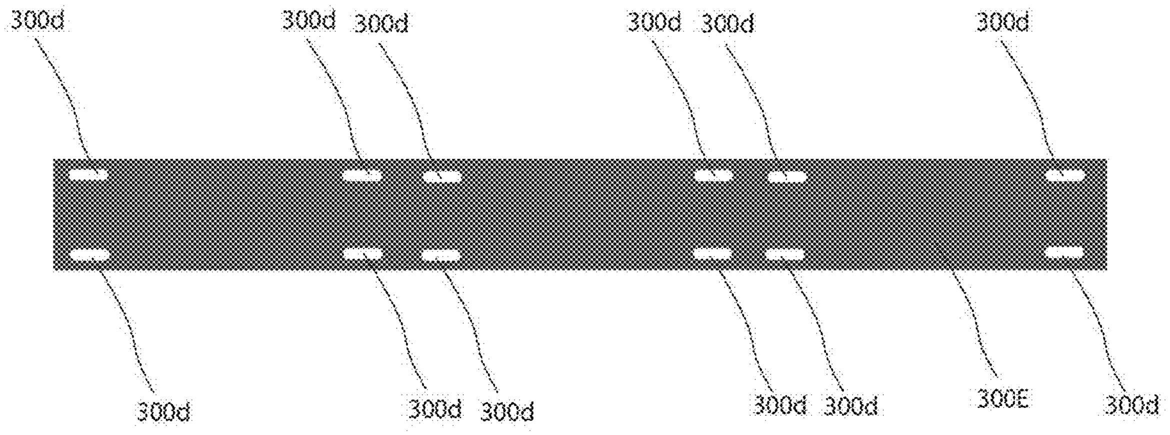
FIG. 27B is a plan view of a substrate of the image sensor device according to Modified Example 5 of the present technology.

In an image sensor device according to Modified Example 5, as depicted in FIGS. 27A and 27B, the second bolt insertion holes 200*d* are provided at four positions (for example, four corners) not on the same straight line of a mounting substrate 200E of a sensor unit 10E. The first bolt insertion holes 300*d* are provided at positions corresponding to the four second bolt insertion holes 200*d* of the attachment section to which a corresponding one of the sensor units 10E is attached of a substrate 300E.

In the image sensor device according to Modified Example 5, the bolt 500 is inserted through the first and second bolt insertion holes 300*d* and 200*d* corresponding to each other, and the nut 600 is threadedly engaged with the screw portion of the bolt 500.

With the image sensor device according to Modified Example 5, the degree of freedom in adjusting the inclination in the transverse and longitudinal directions of the sensor unit 10E with respect to the substrate 300E is higher than that of the image sensor device 3 according to Modified Example 3.

Image Sensor Device According to Modified Example 6

Figure 28A:
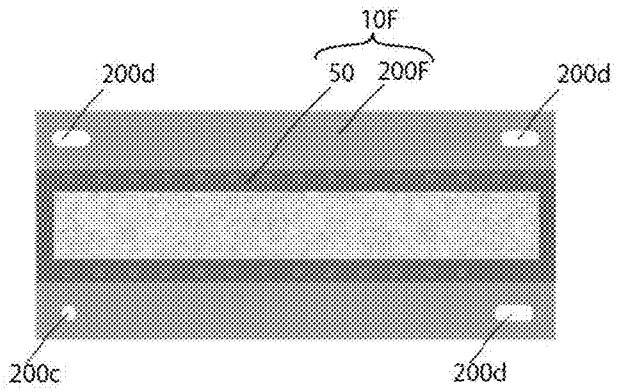
FIG. 28A is a plan view of a sensor unit of an image sensor device according to Modified Example 6 of the present technology.
Figure 28B:
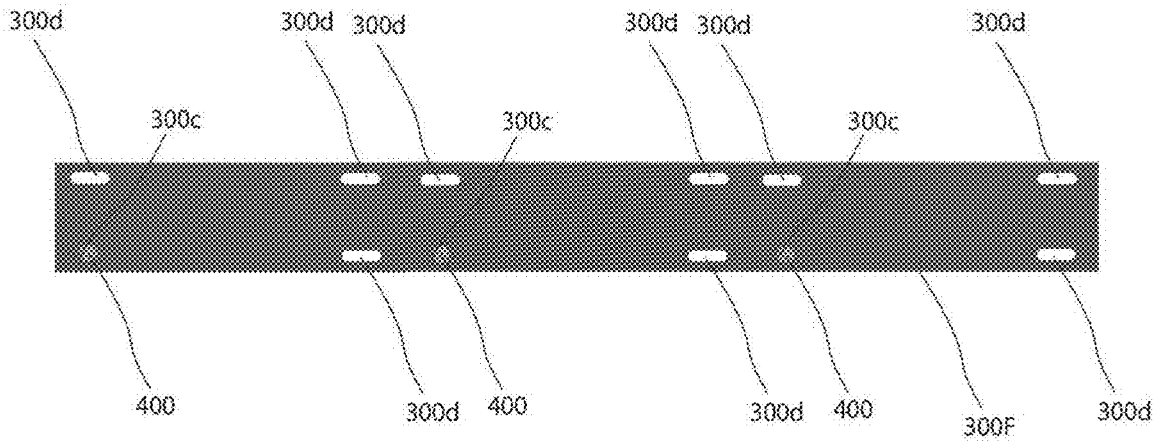
FIG. 28B is a plan view of a substrate of the image sensor device according to Modified Example 6 of the present technology.

In an image sensor device according to Modified Example 6, as depicted in FIGS. 28A and 28B, the second bolt insertion holes 200*d* are provided at three out of four positions (for example, four corners) not on the same straight line of a mounting substrate 200F of a sensor unit 10F, and the pin insertion hole 200*c* is provided at one position. In the attachment section to which a corresponding one of the sensor units 10F is attached of a substrate 300F, the first bolt insertion holes 300*d* are provided at positions corresponding to the three second bolt insertion holes 200*d*, and the pin insertion hole 300*c* to which the pin 400 is inserted and fixed is provided at a position corresponding to the pin insertion hole 200*c*.

In the image sensor device according to Modified Example 6, the bolt 500 is inserted through the first and second bolt insertion holes 300*d* and 200*d* corresponding to each other, the nut 600 is threadedly engaged with the screw portion of the bolt 500, and the pin 400 is inserted into the pin insertion hole 200*c*.

With the image sensor device according to Modified Example 6, the degree of freedom in adjusting the inclination in the transverse and longitudinal directions of the sensor unit 10F with respect to the substrate 300F is higher than that of the image sensor device 4 according to Modified Example 4.

Image Sensor Device According to Modified Example 7

Figure 29:
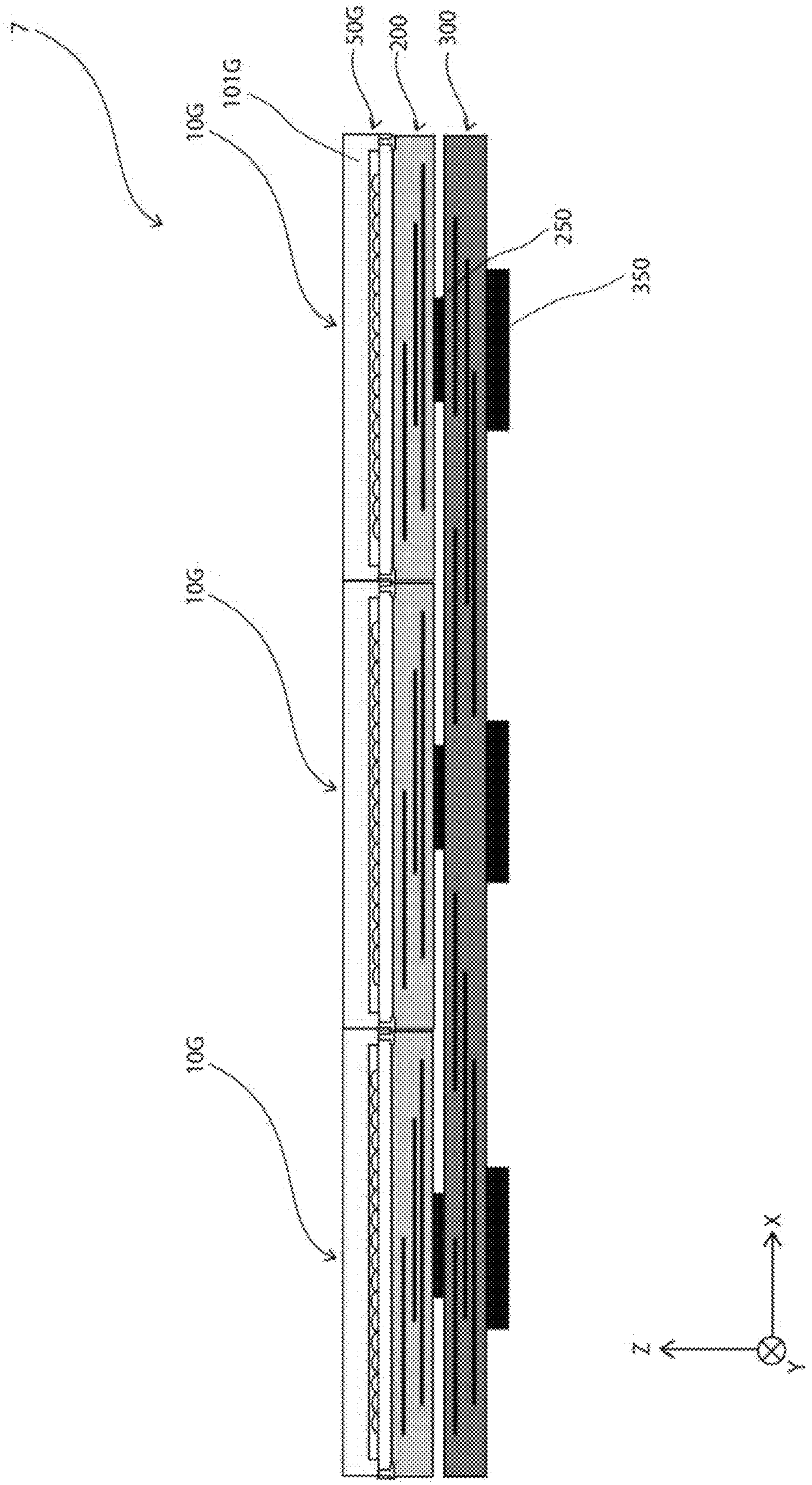
FIG. 29 is a view depicting a longitudinal cross-section of an image sensor device according to Modified Example 7 of the present technology.
Figure 30:
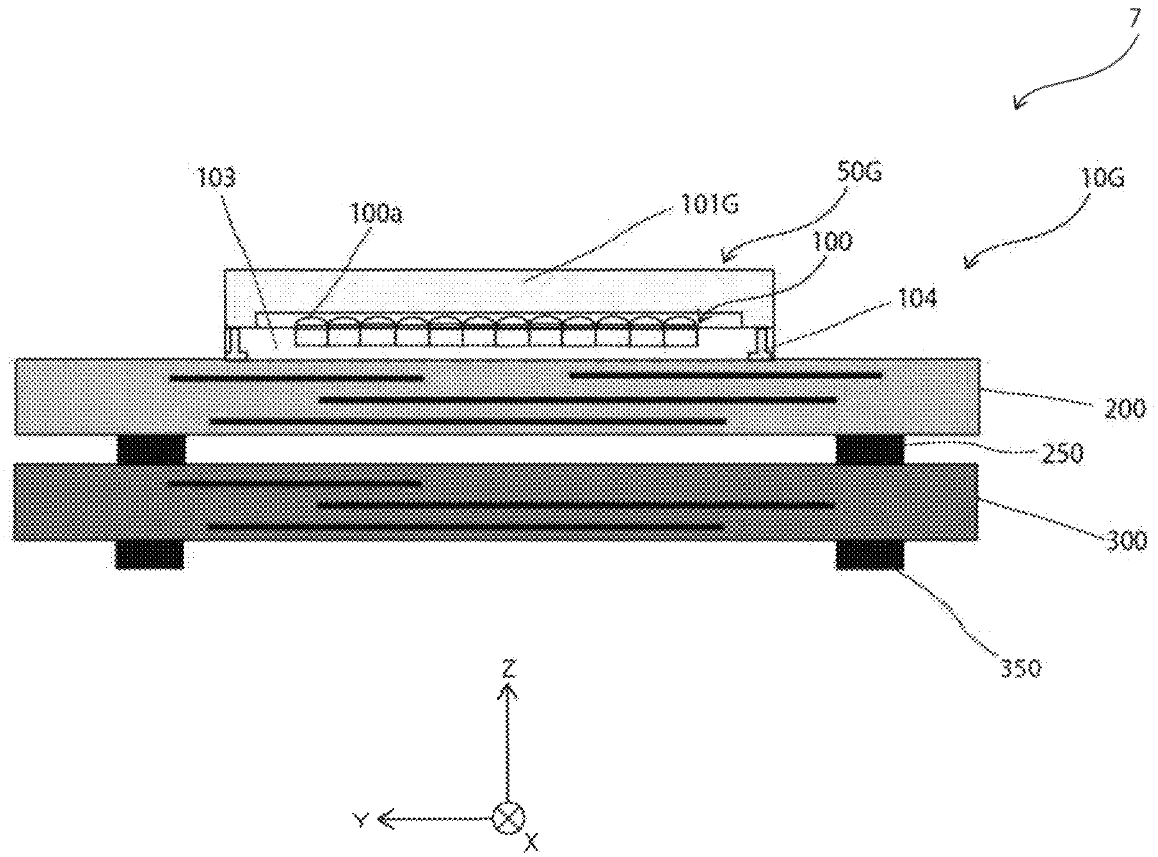
FIG. 30 is a view depicting a transverse cross-section of the image sensor device according to Modified Example 7 of the present technology.

An image sensor device 7 according to Modified Example 7 has, as depicted in FIG. 29 and FIG. 30, a configuration similar to that of the image sensor device 1 according to the embodiment except that a sensor unit 10G includes a translucent cover 101G with a substantially U-shaped cross-section and does not include the spacer 102.

An opening end portion of the translucent cover 101G is bonded (for example, adhered) to the semiconductor substrate 103. That is, the translucent cover 101G functions as both the plate-shaped translucent cover 101 and the spacer 102.

With the image sensor device 7, the number of components and manufacturing processes can be reduced.

Image Sensor Device According to Modified Example 8

Figure 31:
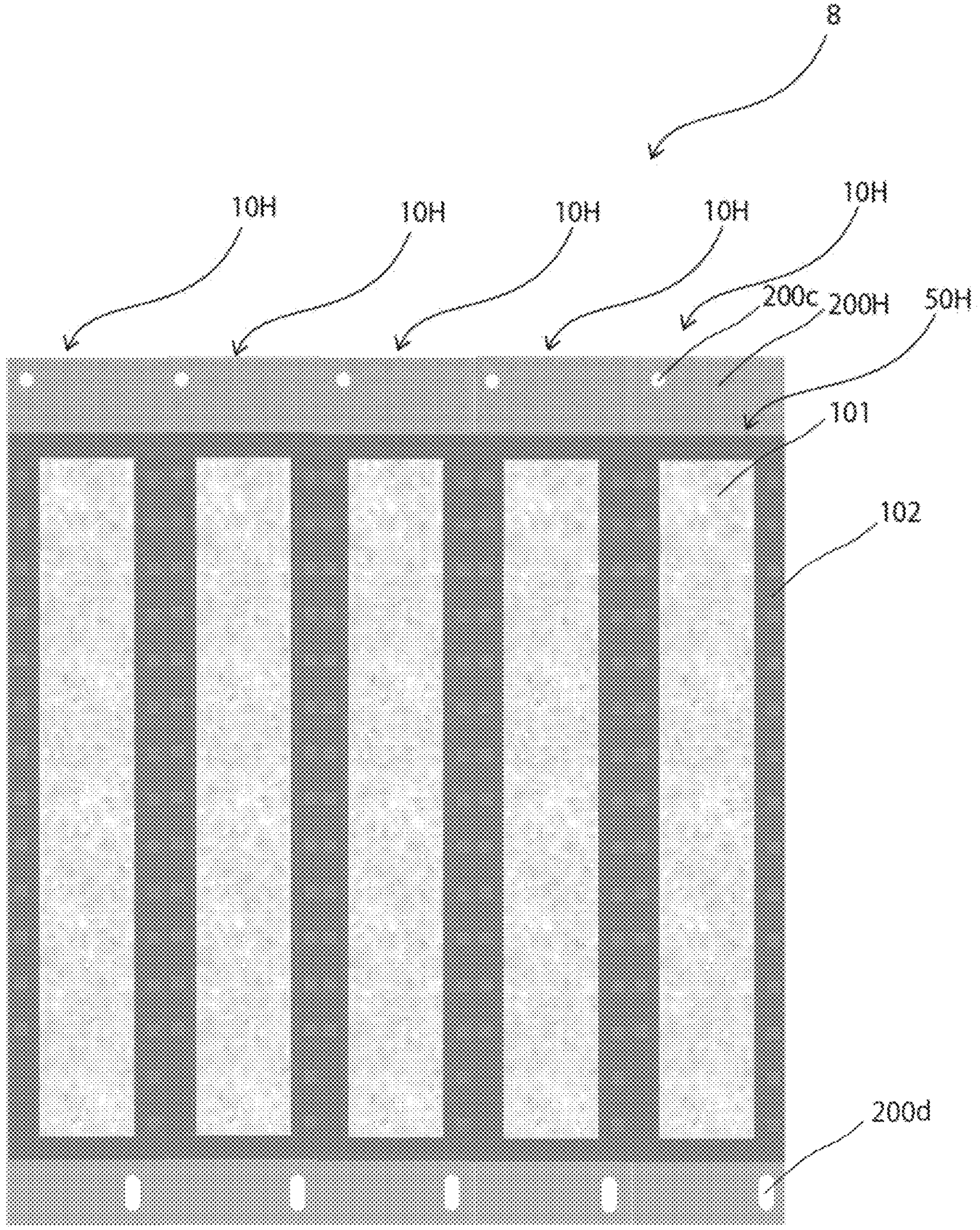
FIG. 31 is a plan view of an image sensor device according to Modified Example 8 of the present technology.
Figure 32:
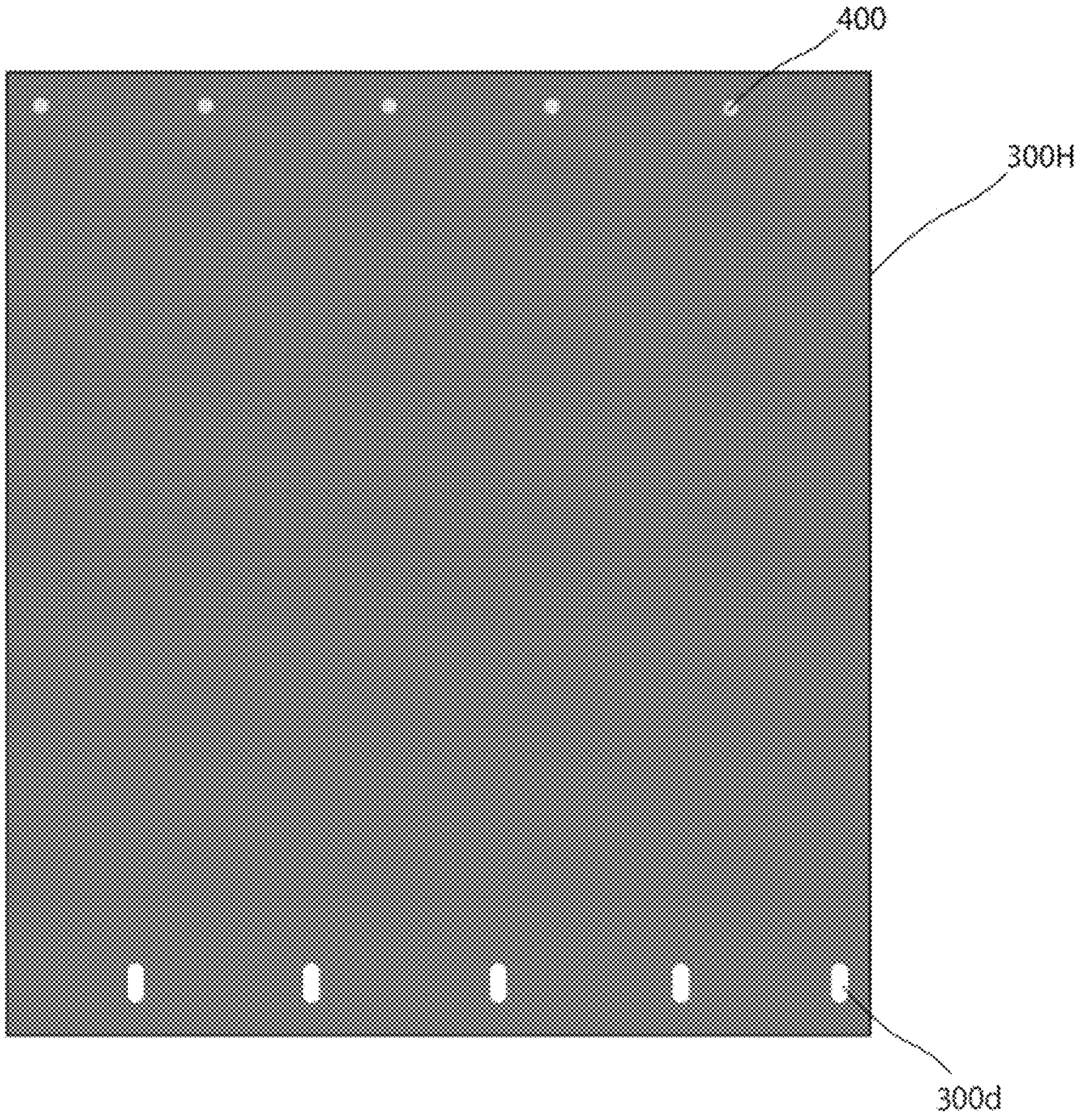
FIG. 32 is a plan view of a substrate of the image sensor device according to Modified Example 8 of the present technology.

An image sensor device 8 according to Modified Example 8 includes a plurality of (for example, five) sensor units 10H, which are depicted in FIG. 31, arranged along the transverse direction of the sensor unit 10H on a substrate 300H, which is depicted in FIG. 32, thereby forming an area image sensor as a whole.

Figure 33:
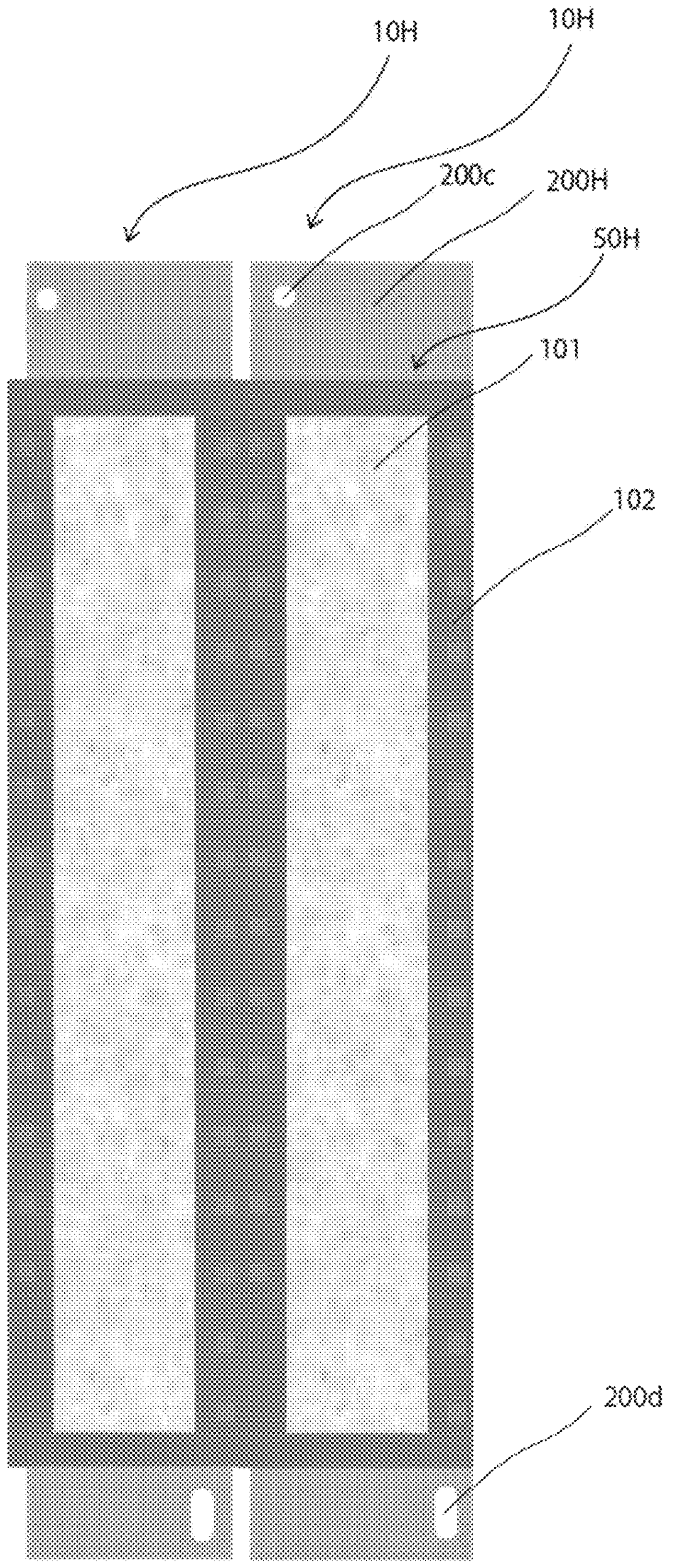
FIG. 33 is a partial enlarged view of FIG. 31.

In each of the sensor units 10H, as depicted in FIG. 33, which is a partial enlarged view of FIG. 31, the pixel chip of a sensor section 50H protrudes in the transverse direction with respect to a mounting substrate 200H (for example, protrudes by an amount corresponding to the difference in linear expansion coefficient between the pixel chip and the mounting substrate), thereby achieving positioning with the end surfaces in the transverse direction of the pixel chips of the two adjacent sensor sections 50H being in abutment against each other.

With the image sensor device 8, there can be achieved an area image sensor that provides effects similar to those of the image sensor device 1 according to the above-mentioned embodiment.

Image Sensor Device According to Modified Example 9

Figure 34:
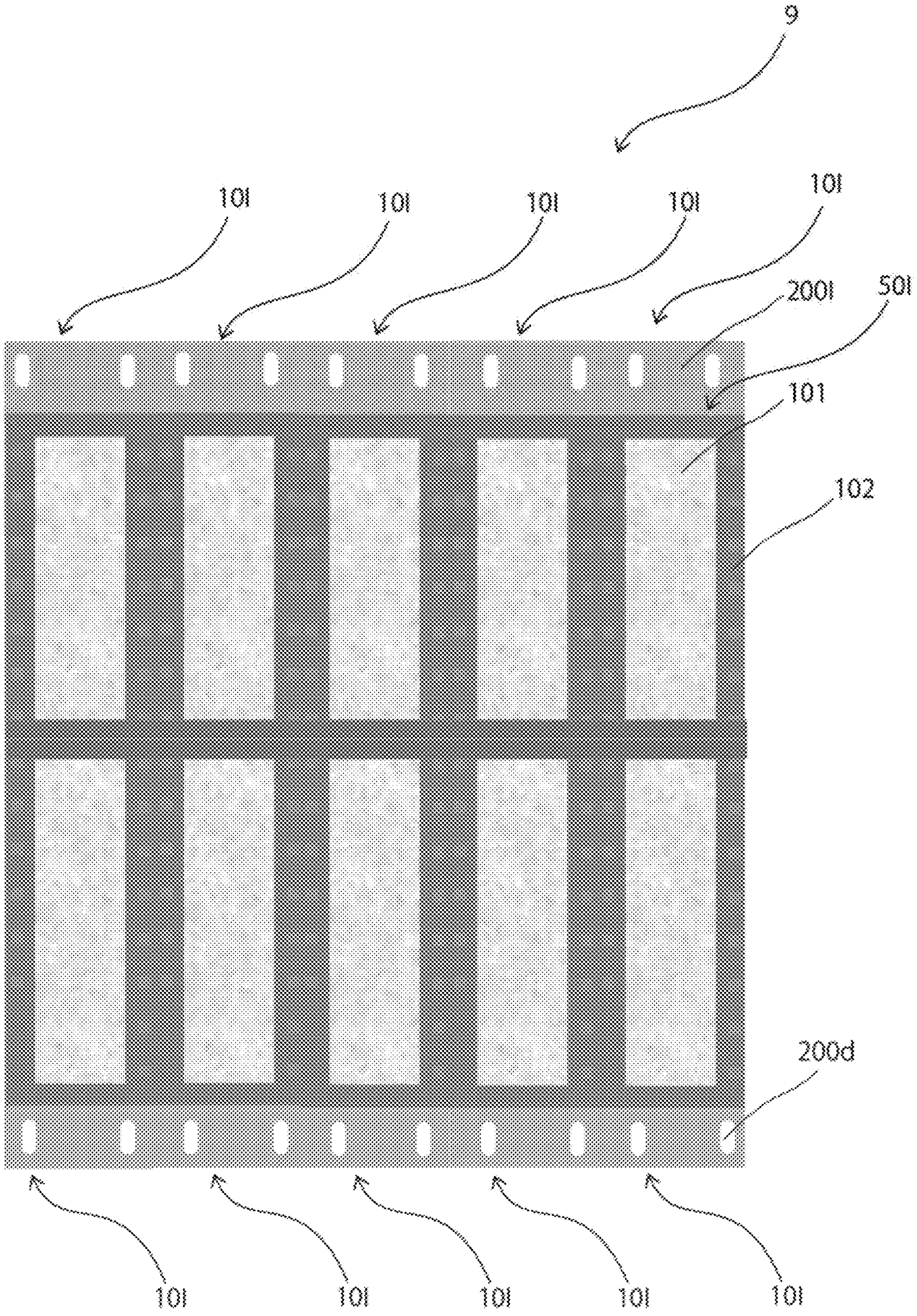
FIG. 34 is a plan view of an image sensor device according to Modified Example 9 of the present technology.
Figure 35:
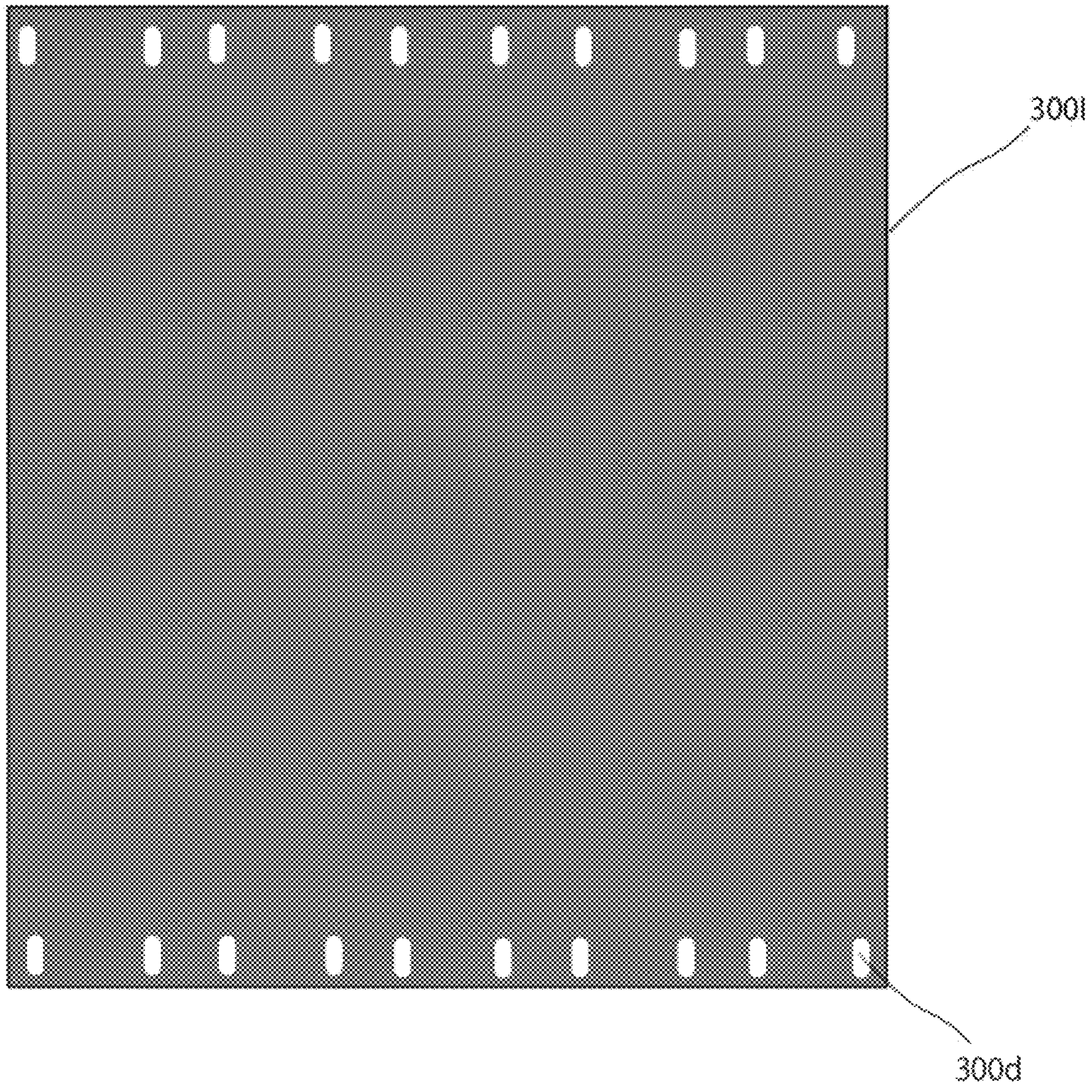
FIG. 35 is a plan view of a substrate of the image sensor device according to Modified Example 9 of the present technology.

An image sensor device 9 according to Modified Example 9 includes a plurality of (for example, 10) sensor units 10I, which are depicted in FIG. 34, arranged two-dimensionally in the transverse and longitudinal directions of the sensor unit 10I on a substrate 300I, which is depicted in FIG. 35, thereby forming an area image sensor as a whole.

In the image sensor device 9, a mounting substrate 200I of each of the sensor units 10I has the two second bolt insertion holes 200*d* arranged in the transverse direction, and the substrate 300I has the two first bolt insertion holes 300*d* corresponding to the two second bolt insertion holes 200*d*. The bolt 500 is inserted through the first and second bolt insertion holes 300*d* and 200*d* corresponding to each other, and the nut 600 is threadedly engaged with the screw portion of the bolt 500.

In each of the sensor units 10I, the pixel chip of a sensor section 50I protrudes in the transverse and longitudinal directions with respect to the mounting substrate 200I (for example, protrudes by an amount corresponding to the difference in linear expansion coefficient between the pixel chip and the mounting substrate), thereby achieving positioning with the end surfaces in the transverse and/or longitudinal direction of the pixel chips of the two adjacent sensor sections 50I being in abutment against each other.

With the image sensor device 9, there can be achieved an area image sensor that provides effects similar to those of the image sensor device 1 according to the above-mentioned embodiment.

3. Other Modified Examples of Present Technology

The configurations of the image sensor devices according to the embodiment and each modified example described above can be appropriately modified.

For example, the configurations of the image sensor devices according to the embodiment and each modified example described above may be combined with each other within the range in which there is no technical contradiction.

The number of sensor units (hereinafter also referred to as the "number of divisions") of the image sensor devices according to the embodiment and each modified example described above is three, but the number of sensor units is not limited to this and may be two or four or more.

In a case where the image sensor device according to the present technology forms, for example, a linear image sensor, the number of sensor units and the length in the longitudinal direction of each sensor unit are optimized with respect to the entire length in the longitudinal direction, thereby making it possible to obtain the effects described earlier in image sensor devices with any entire length in the longitudinal direction. In this case, the sensor units may be different from each other in length in the longitudinal and/or transverse direction.

In a case where the image sensor device according to the present technology forms, for example, an area image sensor, the number of vertical and horizontal divisions and the vertical and horizontal lengths of each sensor unit are optimized with respect to the entire area, thereby allowing for the obtainment of the effects described earlier. In this case, the sensor units may be different from each other in area.

The pixel chip 100 may have a stacked structure in which the semiconductor substrate 103 and a wiring layer are stacked. In this case, for example, the wiring layer and the semiconductor substrate 103 may be arranged in this order from the mounting substrate 200 side (former case), or the semiconductor substrate 103 and the wiring layer may be arranged in this order from the mounting substrate 200 side (latter case). In the former and latter cases, for example, the electrode pads, the wiring layer, and the mounting substrate may be electrically connected to each other by through electrodes penetrating the semiconductor substrate 103 and the wiring layer. In the former case, the electrode pads may be electrically connected to the wiring layer by through electrodes penetrating the semiconductor substrate 103, and the wiring layer may be electrically connected to the mounting substrate 200 by metal bonding or the like. In the latter case, the electrode pads may be electrically connected to the wiring layer by metal bonding or the like, and the wiring layer may be electrically connected to the mounting substrate by through electrodes penetrating the semiconductor substrate 103.

In the embodiment and each modified example described above, the pixel chip may protrude only on one side in one axis direction (for example, the arrangement direction of the plurality of sensor units) with respect to the mounting substrate on which the pixel chip is mounted. For example, the pixel chips of sensor units located at both ends in one axis direction (arrangement direction) of the plurality of sensor units may protrude only toward the pixel chip of the adjacent sensor unit with respect to the mounting substrates on which the pixel chips are mounted.

Figure 36:
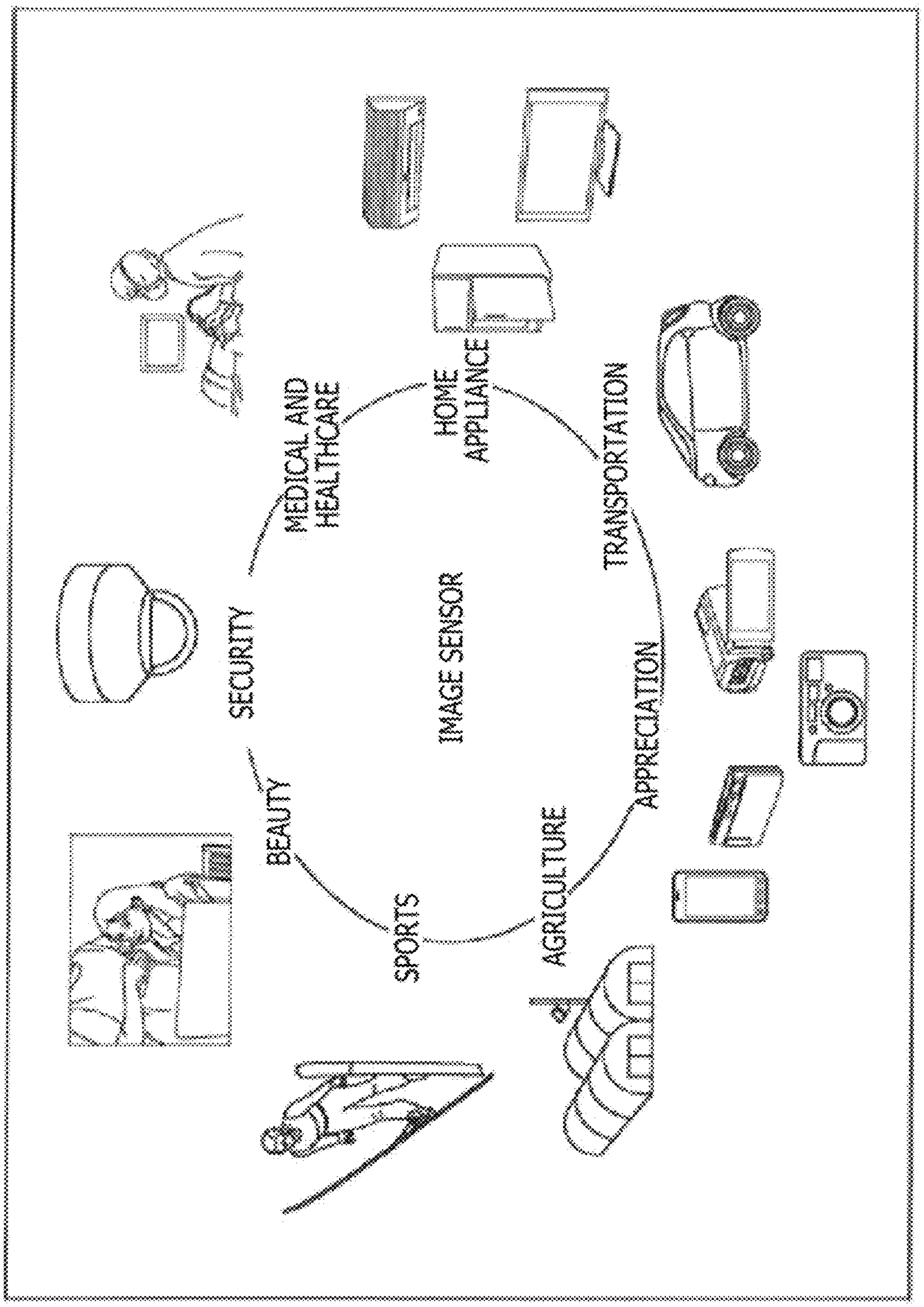
FIG. 36 is a diagram depicting usage examples of solid-state imaging devices of the embodiment and each modified example of the present technology.

4. Usage Examples of Image Sensor Device to which Present Technology is Applied FIG. 36 is a diagram depicting usage examples of the image sensor devices of the embodiment and each modified example of the present technology.

The image sensor devices of the embodiment and each modified example of the present technology can be used in various cases of sensing light such as visible light, infrared light, ultraviolet light, and X-rays as described below, for example. That is, as depicted in FIG. 36, the image sensor devices can be used in devices (equipment) used in the field of appreciation involving capturing images to be used for appreciation purposes, as well as in the fields of transportation, home appliances, medical and healthcare, security, beauty, sports, agriculture, and the like, for example.

Specifically, in the field of appreciation, for example, in devices for capturing images to be used for appreciation purposes, such as digital cameras, smartphones, and mobile phones with camera functions, the image sensor devices of the embodiment and each modified example of the present technology can be used.

In the field of transportation, for example, in devices to be used for transportation purposes, such as on-vehicle sensors configured to capture the front, rear, surroundings, interior, and the like of automobiles for safe driving such as automatic stop, driver's state recognition, or the like, surveillance cameras configured to monitor running vehicles and roads, and ranging sensors configured to measure distances between vehicles or the like, the image sensor devices of the embodiment and each modified example of the present technology can be used.

In the field of home appliances, for example, in devices to be used for home appliances, such as television receivers, refrigerators, and air conditioners, to capture user gestures and perform equipment operations based on those gestures, the image sensor devices of the embodiment and each modified example of the present technology can be used.

In the field of medical and healthcare, for example, in devices to be used for medical and healthcare purposes, such as endoscopes and devices configured to capture blood vessels through the reception of infrared light, the image sensor devices of the embodiment and each modified example of the present technology can be used.

In the field of security, for example, in devices to be used for security purposes, such as surveillance cameras for crime prevention use and cameras for person authentication use, the image sensor devices of the embodiment and each modified example of the present technology can be used.

In the field of beauty, for example, in devices to be used for beauty purposes, such as skin measurement devices configured to capture the skin and microscopes configured to capture the scalp, the image sensor devices of the embodiment and each modified example of the present technology can be used.

In the field of sports, for example, in devices to be used for sports purposes, such as action cameras and wearable cameras for sports use and the like, the image sensor devices of the embodiment and each modified example of the present technology can be used.

In the field of agriculture, for example, in devices to be used for agricultural purposes, such as cameras for monitoring the condition of fields and crops, the image sensor devices of the embodiment and each modified example of the present technology can be used.

Figure 37:
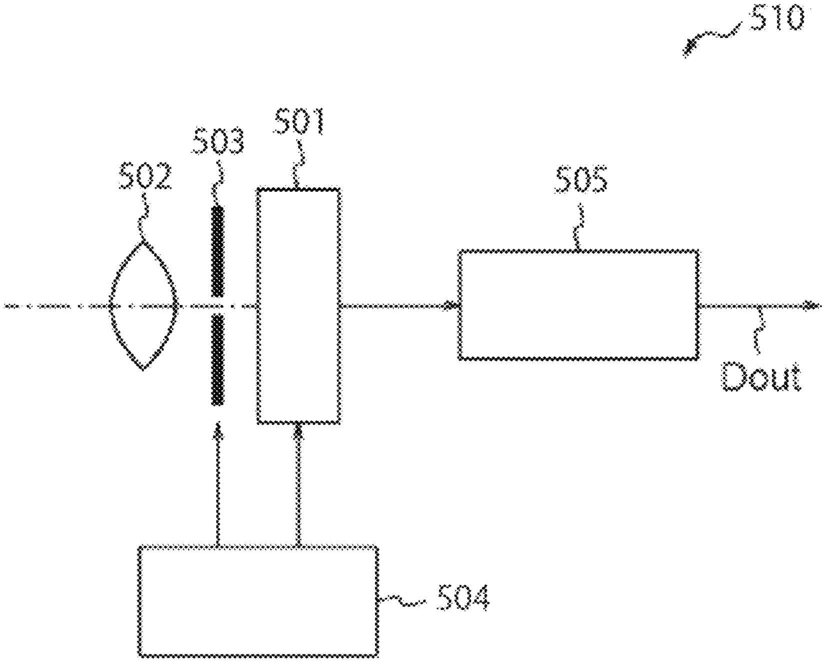
FIG. 37 is a functional block diagram of an example of electronic equipment according to the present technology.

Next, usage examples of the image sensor devices of the embodiment and each modified example of the present technology are specifically described. For example, the image sensor devices of the embodiment and each modified example of the present technology can each be applied as an image sensor device 501 to any type of electronic equipment with imaging functions, such as camera systems including digital still cameras, video cameras, and the like, as well as mobile phones with imaging functions. FIG. 37 depicts the schematic configuration of electronic equipment 510 (camera) as an example. This electronic equipment 510 is, for example, a video camera capable of capturing still or moving images and includes the image sensor device 501, an optical system (optical lens) 502, a shutter device 503, a drive section 504 configured to drive the image sensor device 501 and the shutter device 503, and a signal processing section 505.

The optical system 502 guides image light (incident light) from an object to the pixel region of the image sensor device 501. The optical system 502 may include a plurality of optical lenses. The shutter device 503 controls a period of light emission on the image sensor device 501 and a period of light shielding for the image sensor device 501. The drive section 504 controls the transfer operation of the image sensor device 501 and the shutter operation of the shutter device 503. The signal processing section 505 performs various types of signal processing on the signal output from the image sensor device 501. A video signal Dout after signal processing is stored in a storage medium such as a memory or output to a monitor or the like.

5. Other Usage Examples of Image Sensor Device According to Present Technology The image sensor devices of the embodiment and each modified example of the present technology can also be applied to other electronic equipment configured to detect light, such as TOF (Time Of Flight) sensors. In the case of application to TOF sensors, it is possible to apply the image sensor devices to, for example, distance image sensors using direct TOF measurement methods or distance image sensors using indirect TOF measurement methods. In a distance image sensor using direct TOF measurement methods, light pulses with a short pulse width are transmitted, and electrical pulses are generated by a fast response receiver to determine the time of arrival of photons in the direct time domain in each pixel. The present disclosure can be applied to the receiver in this case. Further, in indirect TOF methods, semiconductor element structures in which the detection and accumulation amount of carriers generated with light varies depending on the arrival timing of light are utilized to measure the time of flight of light. It is also possible to apply the present disclosure as such semiconductor element structures. In the case of application to TOF sensors, it is optional to provide a color filter array and a micro lens array, and at least one of these may not be provided.

The image sensor devices of the embodiment and each modified example of the present technology may be used in devices (equipment) with image reading functions such as facsimile machines and scanners.

6. Application Example to Mobile Body

The technology according to the present disclosure (present technology) can be applied to various products. For example, the technology according to the present disclosure may be implemented as a device (equipment) that is mounted on a mobile body of any type, such as automobiles, electric vehicles, hybrid electric vehicles, motorcycles, bicycles, personal mobilities, airplanes, drones, ships, and robots.

Figure 38:
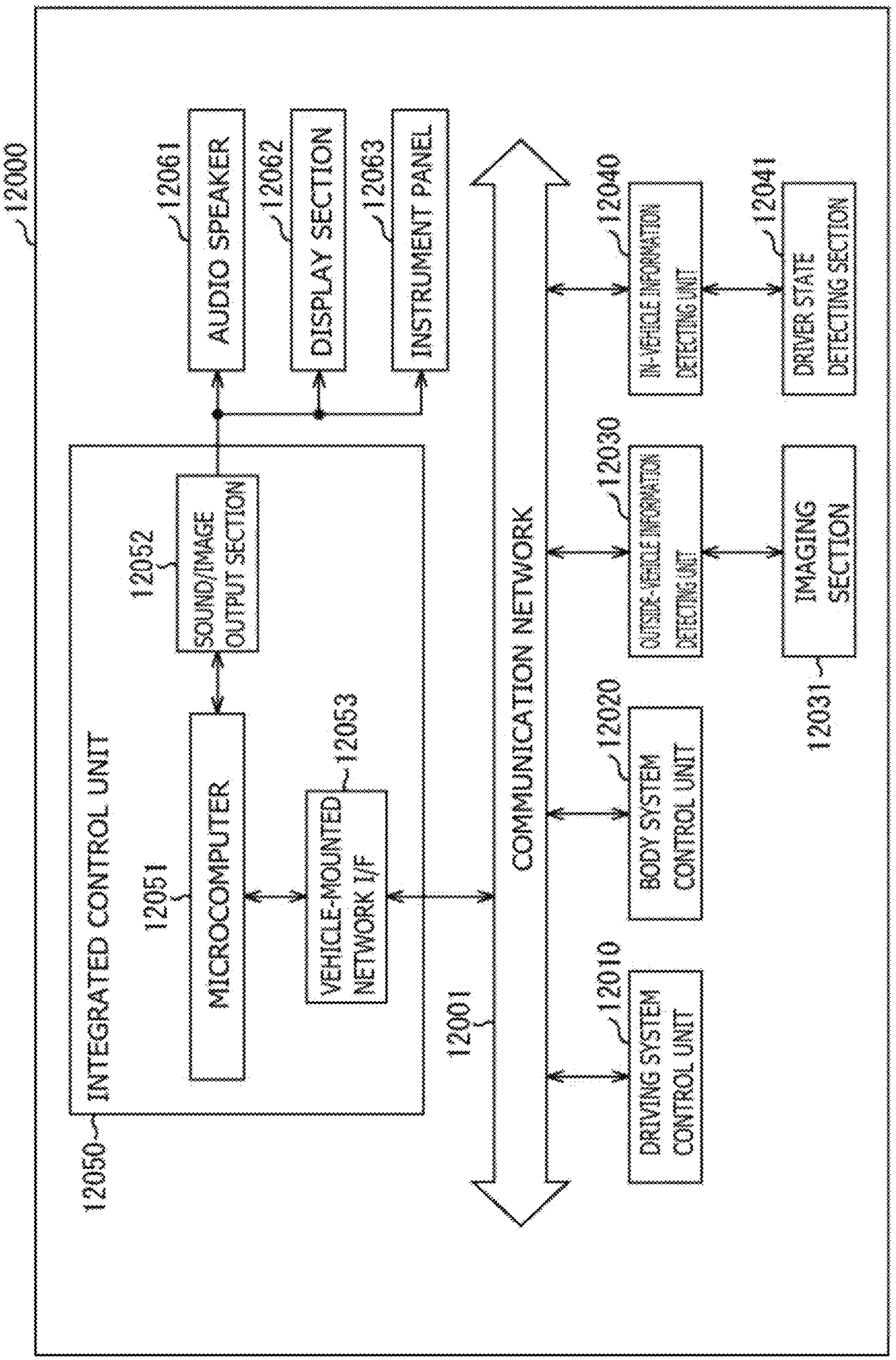
FIG. 38 is a block diagram depicting an example of schematic configuration of a vehicle control system.

FIG. 38 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 38, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 38, an audio speaker 12061, a display section 12062, and an instrument panel 12063 are illustrated as the output device. The display section 12062 may, for example, include at least one of an on-board display and a head-up display.

Figure 39:
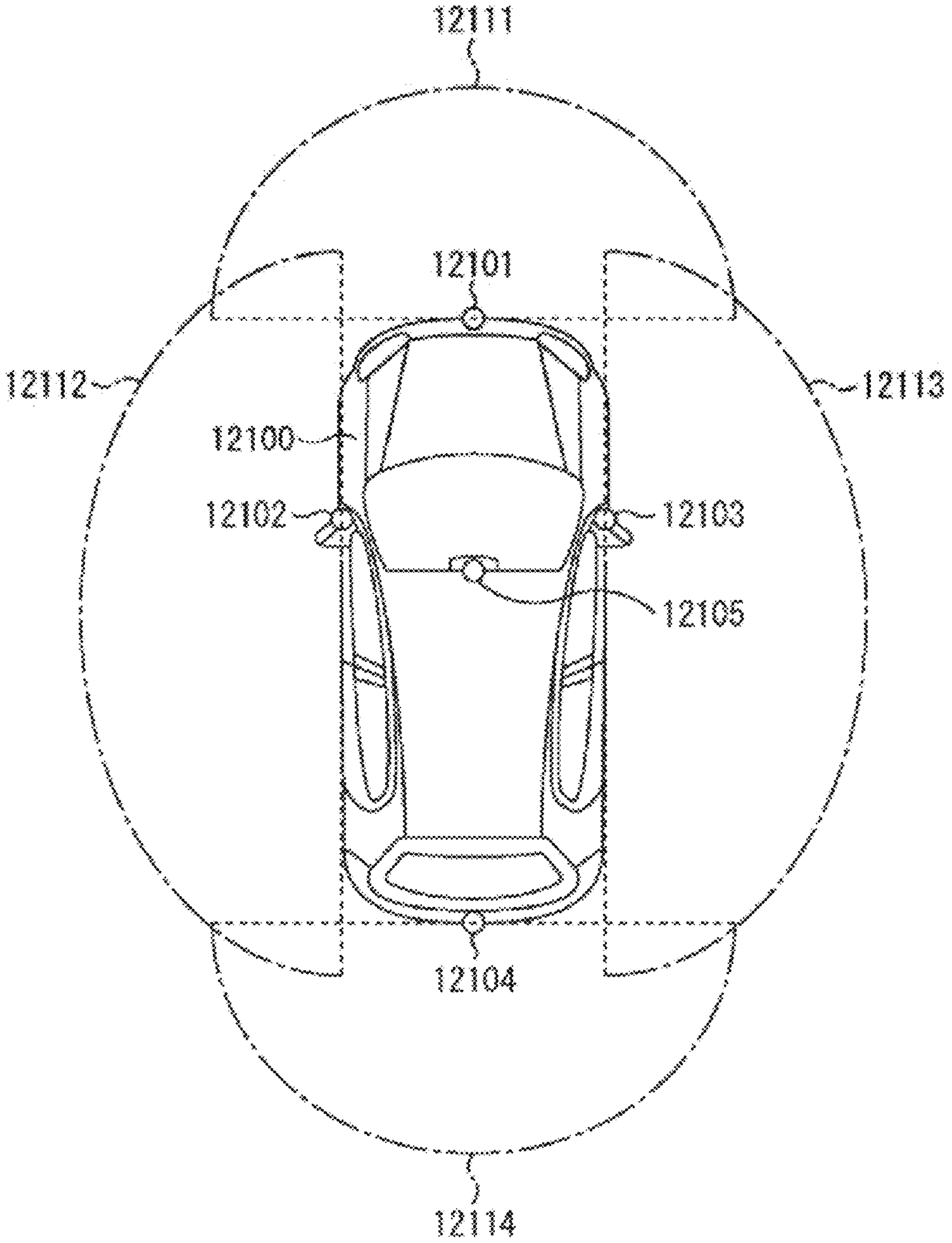
FIG. 39 is a diagram of assistance in explaining an example of installation positions of an outside-vehicle information detecting section and an imaging section.

FIG. 39 is a diagram depicting an example of the installation position of the imaging section 12031.

In FIG. 39, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The image of the front of the vehicle 12100 obtained by the imaging sections 12101 and 12105 is used mainly to detect a preceding vehicle, a pedestrian, an obstacle, a signal, a traffic sign, a lane, or the like.

Incidentally, FIG. 39 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure (present technology) can be applied has been described above. The technology according to the present disclosure can be applied to the imaging section 12031 or the like among the configurations described above, for example. Specifically, a solid-state imaging device 111 of the present disclosure can be applied to the imaging section 12031. The technology according to the present disclosure is applied to the imaging section 12031, thereby making the improvement of yield and reduction in cost associated with manufacturing possible.

7. Application Example to Endoscopic Surgery System

The present technology can be applied to various products. For example, the technology according to the present disclosure (present technology) may be applied to endoscopic surgery systems.

Figure 40:
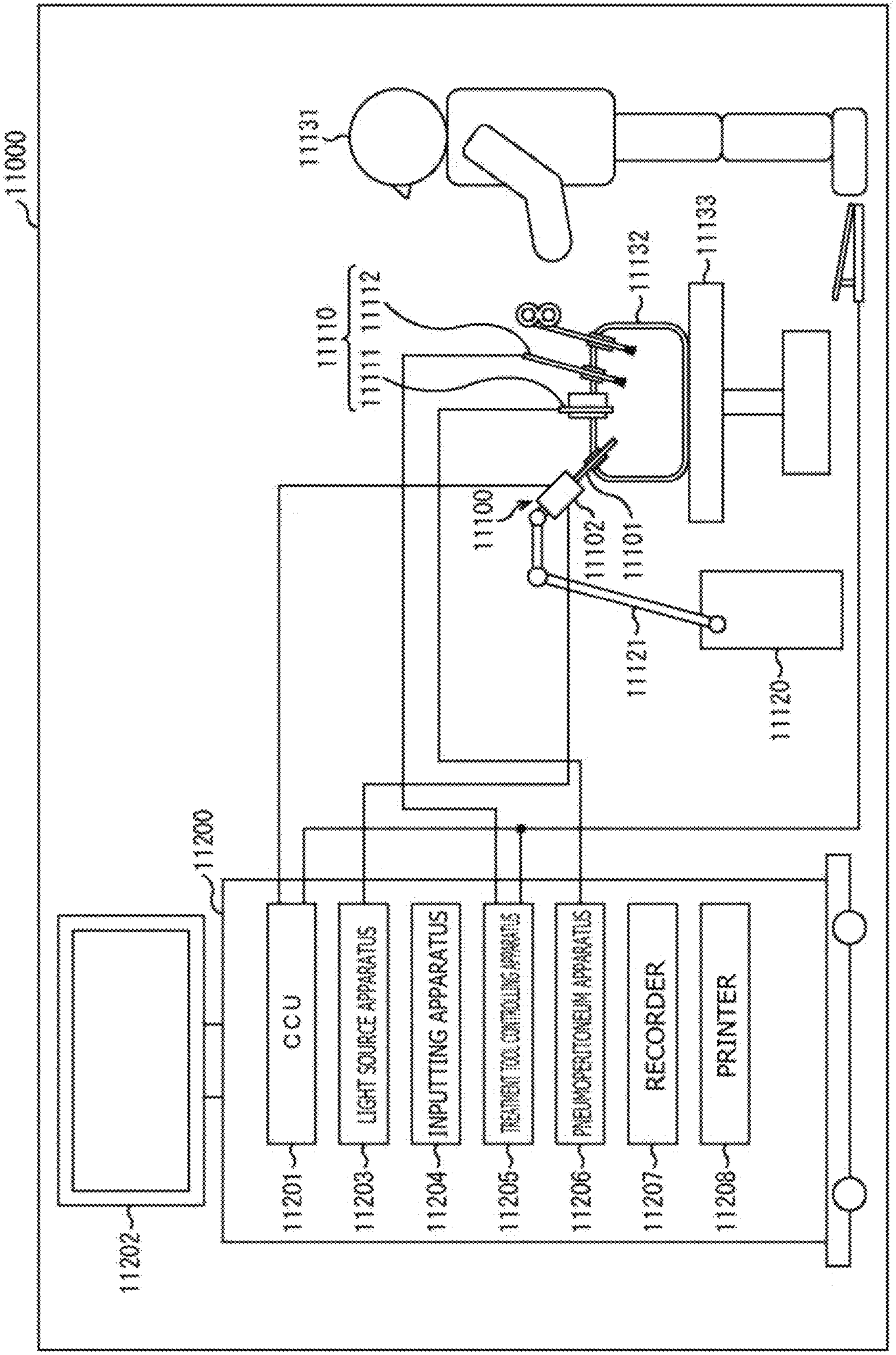
FIG. 40 is a view depicting an example of a schematic configuration of an endoscopic surgery system.

FIG. 40 is a view depicting an example of a schematic configuration of an endoscopic surgery system to which the technology according to an embodiment of the present disclosure (present technology) can be applied.

In FIG. 40, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 41:
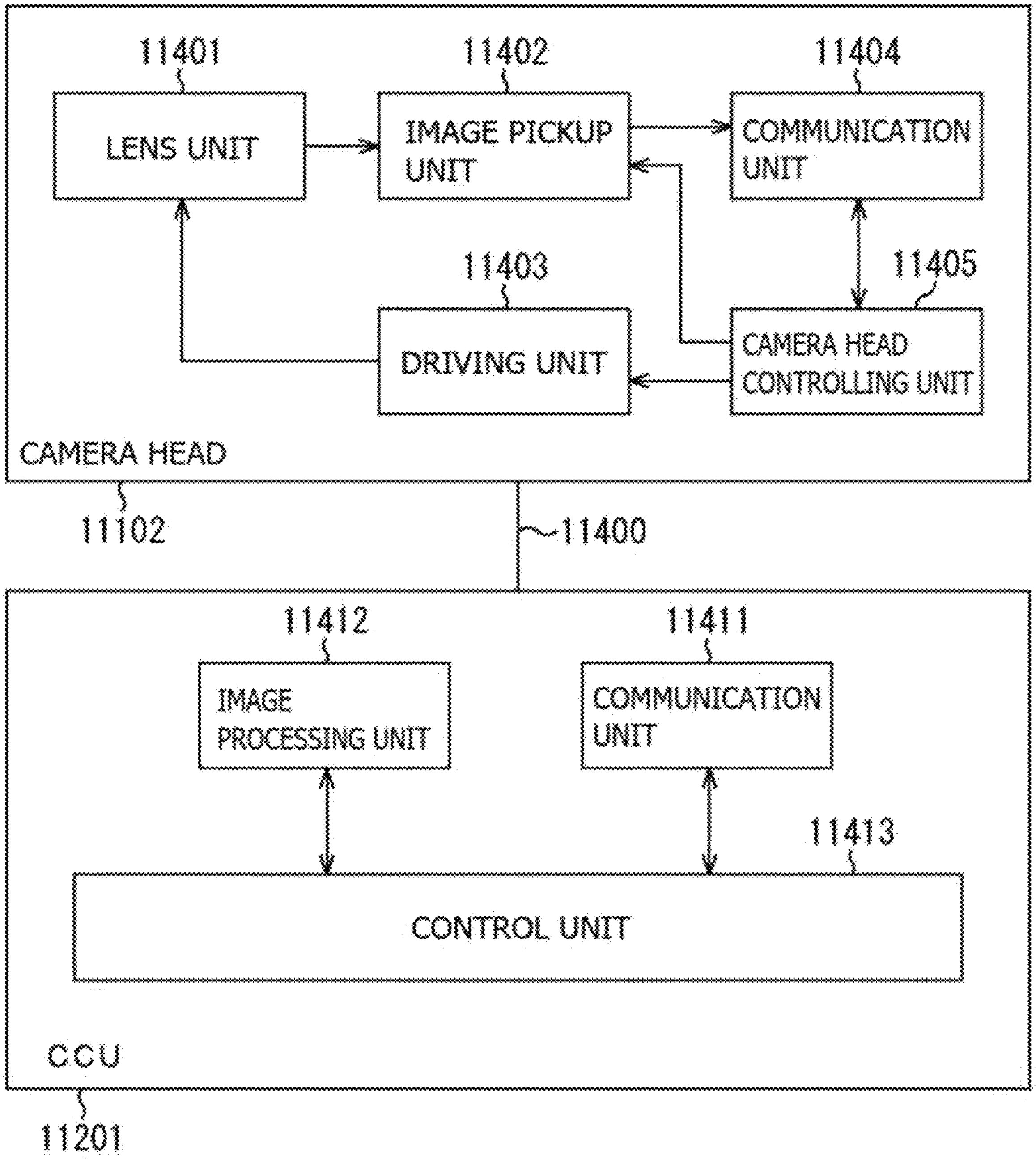
FIG. 41 is a block diagram depicting an example of a functional configuration of a camera head and a camera control unit (CCU).

FIG. 41 is a block diagram depicting an example of a functional configuration of the camera head 11102 and the CCU 11201 depicted in FIG. 40.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The image pickup unit 11402 includes an image pickup element. The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of the endoscopic surgery system to which the technology according to the present disclosure can be applied has been described above. The technology according to the present disclosure can be applied to the endoscope 11100, the camera head 11102 (image pickup unit 11402 thereof), or the like, among the configurations described above. Specifically, the solid-state imaging device 111 of the present disclosure can be applied to the image pickup unit 10402. The technology according to the present disclosure is applied to the endoscope 11100, the camera head 11102 (image pickup unit 11402 thereof), or the like, thereby making the improvement of yield and reduction in cost associated with manufacturing possible.

Here, the endoscopic surgery system has been described as an example. However, the technology according to the present disclosure may also be applied to other systems such as microscope surgery systems.

Further, the present technology can also adopt the following configurations.

(1)

An image sensor device including:

a substrate; and a plurality of sensor units arranged in at least one axis direction on the substrate, in which each of the plurality of sensor units includes a pixel chip including a plurality of pixels, and a translucent cover configured to cover the pixel chip.

(2)

The image sensor device according to (1), in which the plurality of sensor units are arranged in the one axis direction.

(3)

The image sensor device according to (1) or (2), in which the substrate and each of the plurality of sensor units have longitudinal directions that substantially match the one axis direction.

(4)

The image sensor device according to any one of (1) to (3), in which the translucent cover has a plate shape, and each of the plurality of sensor units further includes a spacer disposed between the pixel chip and the translucent cover.

(5)

The image sensor device according to any one of (1) to (4), in which each of the plurality of sensor units further includes a mounting substrate on which the pixel chip is mounted.

(6)

The image sensor device according to (5), in which the pixel chip protrudes on at least one side in the one axis direction with respect to the mounting substrate.

(7)

The image sensor device according to (6), in which the pixel chip protrudes on the at least one side with respect to the mounting substrate by at least an amount corresponding to a difference between a linear expansion coefficient of the pixel chip and a linear expansion coefficient of the mounting substrate.

(8)

The image sensor device according to any one of (1) to (8), further including:

a positioning structure configured to position the substrate and a corresponding one of the plurality of sensor units.

(9)

The image sensor device according to (8), in which the positioning structure includes a pin and a first bolt insertion hole provided to one of the substrate and the mounting substrate, a pin insertion hole which is provided in the other of the substrate and the mounting substrate and into which the pin is inserted, a second bolt insertion hole provided at a position corresponding to the first bolt insertion hole of the other of the substrate and the mounting substrate, a bolt inserted through the first bolt insertion hole and the second bolt insertion hole, and a nut threadedly engaged with the bolt.

(10)

The image sensor device according to (9), in which the pin insertion hole includes a round hole into which the pin is fitted, and the first bolt insertion hole and the second bolt insertion hole include elongated holes with a length in a transverse direction greater than a diameter of a screw portion of the bolt.

(11)

The image sensor device according to (9) or (10), in which a plurality of sets of the first bolt insertion holes and the second bolt insertion holes are provided, the bolt includes a plurality of bolts corresponding to the plurality of sets, and the positioning structure includes at least one spacer through which at least one of the plurality of bolts is inserted and which is disposed between the substrate and the mounting substrate.

(12)

The image sensor device according to (8), in which the positioning structure includes a plurality of first bolt insertion holes provided in one of the substrate and the mounting substrate, a plurality of second bolt insertion holes provided at respective positions corresponding to the plurality of first bolt insertion holes of the other of the substrate and the mounting substrate, a plurality of bolts inserted through respective ones of a plurality of sets of the first bolt insertion holes and the second bolt insertion holes corresponding to each other, and a plurality of nuts threadedly engaged with respective ones of the plurality of bolts.

(13)

The image sensor device according to (12), in which the first bolt insertion holes and the second bolt insertion holes include elongated holes with a length in a transverse direction greater than a diameter of screw portions of the bolts.

(14)

The image sensor device according to (12) or (13), in which at least three sets of the first bolt insertion holes and the second bolt insertion holes are provided, the bolt includes at least three bolts corresponding to the at least three sets, and the positioning structure includes at least one spacer through which at least one of the at least three bolts is inserted and which is disposed between the substrate and the mounting substrate.

(15)

The image sensor device according to any one of (5) to (14), in which the pixel chip is electrically connected to the mounting substrate by wire bonding.

(16)

The image sensor device according to any one of (5) to (14), in which the pixel chip includes a pixel substrate with a pixel region in which the plurality of pixels are provided, and the pixel substrate is provided with a through electrode for electrically connecting an electrode pad provided on an opposite side of a side of the mounting substrate of the pixel substrate to the mounting substrate.

(17)

The image sensor device according to any one of (1) to (16), in which each of the plurality of sensor units is a sensor unit for imaging.

(18)

The image sensor device according to any one of (1) to (17), in which each of the plurality of sensor units is a sensor unit for ranging.

(19)

The image sensor device according to any one of (1) to (17), in which the plurality of sensor units include a sensor unit for imaging and a sensor unit for ranging.

(20)

Equipment including:

the image sensor device according to claim 1.

(21)

A method of manufacturing an image sensor device, the method including:

a step of generating a plurality of sensor units each including a pixel chip and a translucent cover configured to cover the pixel chip; and a step of arranging and mounting the plurality of sensor units in at least one axis direction on a substrate.

(22)

The method of manufacturing an image sensor device according to (21), in which the step of mounting involves sequentially mounting the plurality of sensor units on the substrate.

(23)

The method of manufacturing an image sensor device according to (21) or (22), including:

the step of mounting involves fixing, after adjusting a position of each of the sensor units with respect to the substrate, the sensor units to the substrate.

REFERENCE SIGNS LIST

1, 3, 4, 7, 8, 9, 501: Image sensor device

10, 10A, 10B, 10C, 10D, 10E, 10F, 10G, 10H, 10I: Sensor unit

100: Pixel chip

100*a*: Pixel

101, 101G: Translucent cover

102: Spacer

103: Semiconductor substrate (pixel substrate)

104: Through electrode

200, 200A, 200C, 200D, 200E, 200F, 200H, 200I: Mounting substrate

200*c*: Pin insertion hole

200*d*: Second bolt insertion hole

300, 300A, 300C, 300D, 300E, 300F, 300H, 300I: Substrate

300*d*: First bolt insertion hole

510: Electronic equipment (equipment)

BW: Bonding wire

The invention claimed is:

1. An image sensor device, comprising:

a first substrate;

a plurality of sensor units in at least one axis direction on the first substrate, wherein the at least one axis direction is with respect to the first substrate, and each sensor unit of the plurality of sensor units includes:

a second substrate;

a pixel chip on the second substrate, wherein the pixel chip includes a plurality of pixels; and a translucent cover configured to cover the pixel chip; and a positioning structure configured to position the first substrate and a corresponding sensor unit of the plurality of sensor units, wherein the positioning structure includes:

a pin;

a first bolt insertion hole in the first substrate;

a pin insertion hole in each of the first substrate and the second substrate, wherein a first end portion of the pin is in the pin insertion hole of the first substrate, and a second end portion of the pin is inserted through the pin insertion hole of the second substrate;

a second bolt insertion hole in the second substrate, wherein the second bolt insertion hole is at a position corresponding to the first bolt insertion hole of the first substrate;

a bolt in each of the first bolt insertion hole and the second bolt insertion hole; and a nut that is threadedly engaged with the bolt.

2. The image sensor device according to claim 1, wherein the plurality of sensor units is in one axis direction of the at least one axis direction.

3. The image sensor device according to claim 2, wherein longitudinal directions of the first substrate and longitudinal directions of each sensor unit of the plurality of sensor units match the one axis direction.

4. The image sensor device according to claim 1, wherein the translucent cover has a plate shape, and each sensor unit of the plurality of sensor units further includes a spacer between the pixel chip and the translucent cover.

5. The image sensor device according to claim 1, wherein the pixel chip protrudes on at least one side in the at least one axis direction with respect to the second substrate.

6. The image sensor device according to claim 5, wherein the pixel chip protrudes on the at least one side with respect to the second substrate by a specific amount, and the specific amount corresponds to a difference between a linear expansion coefficient of the pixel chip and a linear expansion coefficient of the second substrate.

7. The image sensor device according to claim 1, wherein the pin insertion hole includes a round hole for insertion of the pin, the first bolt insertion hole and the second bolt insertion hole include elongated holes with a length in a transverse direction, the transverse direction is with respect to the first substrate, and the length of the elongated holes is greater than a diameter of a screw portion of the bolt.

8. The image sensor device according to claim 1, further comprising:

a plurality of sets of first bolt insertion holes, including the first bolt insertion hole; and a plurality of sets of second bolt insertion holes, including the second bolt insertion hole, wherein the bolt includes a plurality of bolts corresponding to the plurality of sets of first bolt insertion holes and the plurality of sets of second bolt insertion holes, the positioning structure further includes at least one spacer through which at least one of the plurality of bolts is insertable, and the at least one spacer is between the first substrate and the second substrate.

9. The image sensor device according to claim 1, wherein the positioning structure further includes:

a plurality of sets of first bolt insertion holes in the first substrate, the plurality of sets of first bolt insertion holes including the first bolt insertion hole;

a plurality of sets of second bolt insertion holes in the second substrate, the plurality of sets of second bolt insertion holes including the second bolt insertion hole, wherein the plurality of sets of second bolt insertion holes is at respective positions corresponding to the plurality of sets of first bolt insertion holes;

a plurality of bolts that are insertable through respective ones of the plurality of sets of first bolt insertion holes and the plurality of sets of second bolt insertion holes; and a plurality of nuts threadedly engaged with respective ones of the plurality of bolts.

10. The image sensor device according to claim 9, wherein the plurality of sets of first bolt insertion holes and the plurality of sets of second bolt insertion holes include elongated holes, and each elongated hole of the elongated holes has a length in a transverse direction greater than a diameter of screw portion of the bolt.

11. The image sensor device according to claim 9, wherein the plurality of sets of first bolt insertion holes includes at least three sets of first bolt insertion holes, the plurality of sets of second bolt insertion holes includes at least three sets of second bolt insertion holes, the plurality of bolts includes at least three bolts corresponding to both of the at least three sets of first bolt insertion holes and the at least three sets of second bolt insertion holes, the positioning structure further includes at least one spacer through which at least one of the at least three bolts is insertable, and the at least one spacer is between the first substrate and the second substrate.

12. The image sensor device according to claim 1, wherein the pixel chip is electrically connected to the second substrate by wire bonding.

13. The image sensor device according to claim 1, further comprising an electrode pad on an opposite side of a side of the second substrate, wherein the pixel chip further includes a pixel substrate and a pixel region, the plurality of pixels is in the pixel region, and the pixel substrate includes a through electrode to electrically connect the electrode pad to the second substrate.

14. The image sensor device according to claim 1, wherein each sensor unit of the plurality of sensor units is for imaging.

15. The image sensor device according to claim 1, wherein each sensor unit of the plurality of sensor units is for ranging.

16. The image sensor device according to claim 1, wherein the plurality of sensor units includes a first sensor unit for imaging and a second sensor unit for ranging.

17. An equipment, comprising:

an image sensor device, wherein the image sensor device comprises:

a first substrate;

a plurality of sensor units in at least one axis direction on the first substrate, wherein the at least one axis direction is with respect to the first substrate, and each sensor unit of the plurality of sensor units includes:

a second substrate;

a pixel chip on the second substrate, wherein the pixel chip includes a plurality of pixels; and a translucent cover configured to cover the pixel chip; and a positioning structure configured to position the first substrate and a corresponding sensor unit of the plurality of sensor units, wherein the positioning structure includes:

a pin;

a first bolt insertion hole in the first substrate;

a pin insertion hole in each of the first substrate and the second substrate, wherein a first end portion of the pin is in the pin insertion hole of the first substrate, and a second end portion of the pin is inserted through the pin insertion hole of the second substrate;

a second bolt insertion hole in the second substrate, wherein the second bolt insertion hole is at a position corresponding to the first bolt insertion hole of the first substrate;

a bolt in each of the first bolt insertion hole and the second bolt insertion hole; and a nut that is threadedly engaged with the bolt.

18. A method of manufacturing an image sensor device, the method comprising:

mounting a plurality of sensor units in at least one axis direction on a first substrate, wherein the at least one axis direction is with respect to the first substrate, and each sensor unit of the plurality of sensor units includes:

a second substrate;

a pixel chip on the second substrate, wherein the pixel chip includes a plurality of pixels; and a translucent cover configured to cover the pixel chip; and positioning, by a positioning structure, the first substrate and a corresponding sensor unit of the plurality of sensor units, wherein the positioning structure includes:

a pin;

a first bolt insertion hole in the first substrate;

a pin insertion hole in each of the first substrate and the second substrate, wherein a first end portion of the pin is in the pin insertion hole of the first substrate, and a second end portion of the pin is inserted through the pin insertion hole of the second substrate;

a second bolt insertion hole in the second substrate, wherein the second bolt insertion hole is at a position corresponding to the first bolt insertion hole of the first substrate;

a bolt in each of the first bolt insertion hole and the second bolt insertion hole; and a nut that is threadedly engaged with the bolt.

19. The method according to claim 18, wherein the mounting of the plurality of sensor units in the at least one axis direction on the first substrate includes:

adjusting a position of each sensor unit of the plurality of sensor units with respect to the first substrate; and fixing the plurality of sensor units to the first substrate.

* * * * *